(12) United States Patent
Kirsch et al.

(10) Patent No.: US 12,163,223 B2
(45) Date of Patent: Dec. 10, 2024

(54) PROCESS FOR THE PRODUCTION OF A MOLECULAR LAYER AND ELECTRONIC COMPONENT COMPRISING SAME

(71) Applicant: Merck Patent GmbH, Darmstadt (DE)

(72) Inventors: Peer Kirsch, Darmstadt (DE); Sebastian Resch, Darmstadt (DE); Henning Seim, Darmstadt (DE); Jacob Woodruff, Philadelphia, PA (US); Charith Nanayakkara, Philadelphia, PA (US)

(73) Assignee: MERCK PATENT GMBH, Darmstadt (DE)

( * ) Notice: Subject to any disclaimer, the term of this patent is extended or adjusted under 35 U.S.C. 154(b) by 253 days.

(21) Appl. No.: 17/772,547

(22) PCT Filed: Oct. 28, 2020

(86) PCT No.: PCT/EP2020/080237
§ 371 (c)(1),
(2) Date: Apr. 28, 2022

(87) PCT Pub. No.: WO2021/083934
PCT Pub. Date: May 6, 2021

(65) Prior Publication Data
US 2023/0002898 A1    Jan. 5, 2023

(30) Foreign Application Priority Data
Oct. 29, 2019 (EP) ..................... 19205912

(51) Int. Cl.
C23C 16/455    (2006.01)
H10K 71/10    (2023.01)
(Continued)

(52) U.S. Cl.
CPC ....... C23C 16/45551 (2013.01); H10K 71/10 (2023.02); H10K 85/111 (2023.02);
(Continued)

(58) Field of Classification Search
CPC ........ C23C 16/45551; C23C 16/45525; C23C 16/45529
See application file for complete search history.

(56) References Cited

U.S. PATENT DOCUMENTS 5,397,488 A * 3/1995 Chen .................... C10M 105/32
508/374
6,235,690 B1    5/2001 Shibayama et al.
(Continued)

FOREIGN PATENT DOCUMENTS

CN    108598005 B    5/2021
DE    102015000120 A1    7/2016
(Continued)

OTHER PUBLICATIONS

Lau, W.S., et al., "Surface smoothing effect of an amorphous thin film deposited by atomic layer deposition on a surface with nano-sized roughness". AIP Advances 4,027120 (2014) pp. 1-5.*
(Continued)

*Primary Examiner* — Bret P Chen
(74) *Attorney, Agent, or Firm* — MILLEN, WHITE, ZELANO & BRANIGAN, P.C.; Brion P. Heaney

(57) ABSTRACT

A process is described for production of a molecular layer on a substrate using atomic layer deposition (ALD) techniques, for use in electronic components, in particular, in memory elements of the ReRAM type. Additionally, compounds for production of the molecular layer are disclosed, as well as memory elements containing the molecular layer.

13 Claims, 3 Drawing Sheets

(51) Int. Cl.
*H10K 85/10* (2023.01)
*H10N 70/00* (2023.01)

(52) U.S. Cl.
CPC ......... *H10K 85/113* (2023.02); *H10K 85/141* (2023.02); *H10N 70/023* (2023.02)

(56) References Cited

U.S. PATENT DOCUMENTS

| | | | |
|---|---|---|---|
| 6,995,081 B2* | 2/2006 | Vaartstra | H01L 21/76843 438/653 |
| 8,318,252 B2 | 11/2012 | Xiao | |
| 9,172,053 B2 | 10/2015 | Hayashi et al. | |
| 9,234,136 B2 | 1/2016 | Archetti et al. | |
| 9,957,285 B2* | 5/2018 | Kishida | B01D 53/228 |
| 10,301,545 B2 | 5/2019 | Archetti et al. | |
| 10,741,778 B2 | 8/2020 | Kirsch et al. | |
| 11,063,227 B2 | 7/2021 | Kirsch et al. | |
| 2005/0099209 A1 | 5/2005 | Luyken et al. | |
| 2005/0159634 A1* | 7/2005 | Dahl | C07C 45/28 585/17 |
| 2009/0137043 A1* | 5/2009 | Parsons | C23C 16/45525 428/221 |
| 2009/0214860 A1* | 8/2009 | Enoki | H01L 21/02118 428/339 |
| 2013/0118564 A1* | 5/2013 | Cheung | H01L 21/02579 136/252 |
| 2013/0134376 A1* | 5/2013 | Tong | H10B 63/80 257/4 |
| 2014/0008601 A1 | 1/2014 | Nishizawa et al. | |
| 2014/0342954 A1* | 11/2014 | Ingber | A61L 29/08 210/502.1 |
| 2016/0049416 A1* | 2/2016 | Hosaka | H01L 29/66545 438/588 |
| 2016/0144079 A1* | 5/2016 | Ingber | A61L 29/085 508/106 |
| 2016/0211461 A1* | 7/2016 | Nicht | H10K 10/84 |
| 2018/0366666 A1* | 12/2018 | Lu | H10K 10/491 |
| 2019/0157334 A1* | 5/2019 | Wei | H01L 27/14683 |
| 2019/0186008 A1* | 6/2019 | Tutt | C23C 16/4412 |
| 2021/0257569 A1 | 8/2021 | Kirsch et al. | |

FOREIGN PATENT DOCUMENTS

| | | |
|---|---|---|
| EP | 2698373 B1 | 9/2018 |
| JP | 2005002164 A | 1/2005 |
| JP | 2007177051 A | 7/2007 |
| WO | 2012127542 A1 | 9/2012 |
| WO | 2013004372 A1 | 1/2013 |
| WO | 2014169988 A1 | 10/2014 |
| WO | 2016110301 A1 | 7/2016 |
| WO | 2018007337 A2 | 1/2018 |
| WO | 2019238649 A1 | 12/2019 |

OTHER PUBLICATIONS

Staszuk, M., "Application of PVD and ALD Methods for Surface Treatment of Al—Si—Cu Alloys". Solid State Phenomena, 293, (2019) 1 page. Abstract Only.*
Van Bui, H., et al., "Atomic and molecular layer deposition: off the beaten track". Chem. Commun., 2017, 53, 45-71.*
O'Neill, Brandon J., et al., "Catalyst Design with Atomic Layer Deposition". ACS Catalysis, 2015, 5, 1804-1825.*
Hu, Liang, et al., "Coating strategies for atomic layer deposition". Nanotechnology Review 2017, 6(6), pp. 527-547.*
Schreiber, "Structure and growth of self-assembling monolayers" Progress in Surface Science 2000, Oxford, 65, 5-8, 151-256.
International Search Report PCT/EP2020/080237 dated Jan. 11, 2021 (pp. 1-3).

* cited by examiner

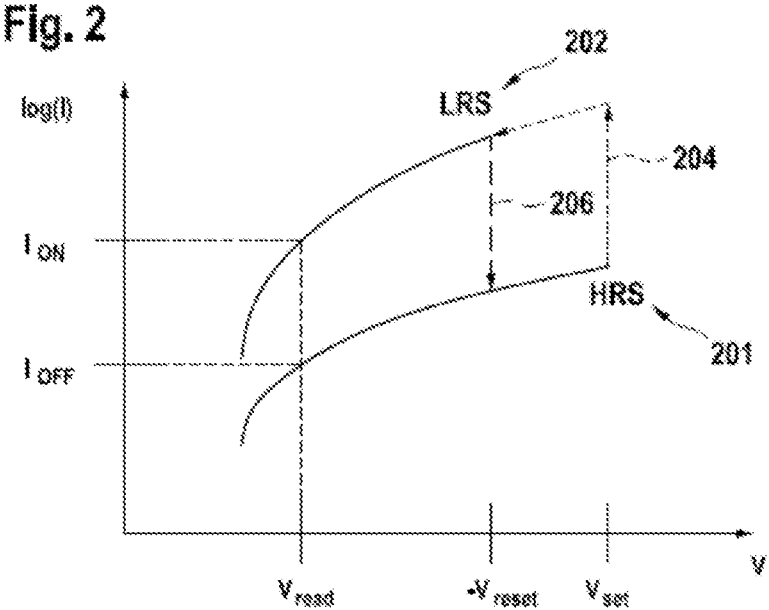
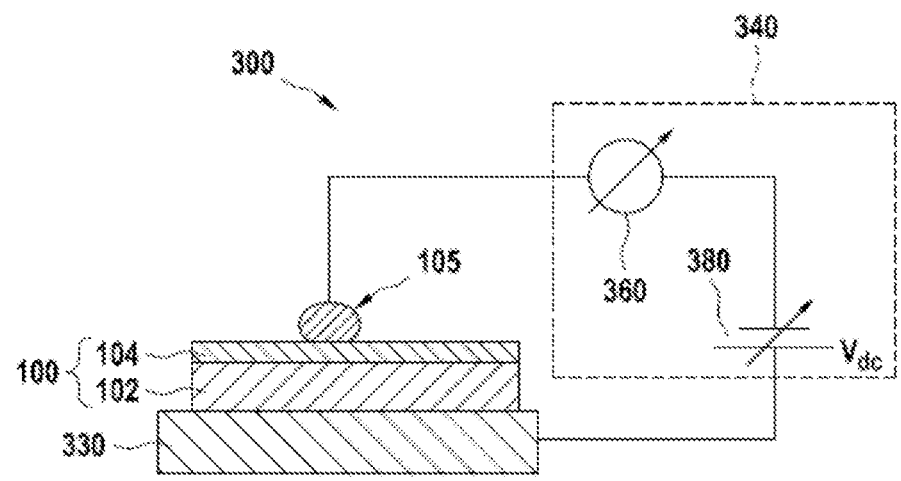

PROCESS FOR THE PRODUCTION OF A MOLECULAR LAYER AND ELECTRONIC COMPONENT COMPRISING SAME

The invention relates to a process for the production of a molecular layer on a substrate using atomic layer deposition (ALD) techniques, for use in electronic components, in particular in memory elements of the ReRAM type, in which at least one layer of an electronic device and the molecular layer are deposited sequentially without breaking vacuum in a deposition chamber. The present invention furthermore relates to compounds for the production of the molecular layer and to memory elements comprising the molecular layer.

Molecular layers, in particular self-assembled monolayers (SAM) are known to the person skilled in the art (F. Schreiber: "Structure and growth of self-assembling monolayers", Progress in Surface Science, Oxford, G B, Vol. 65, No. 5-8, 1 Nov. 2000, pages 151-256) and serve, for example, for the modification of electrode surfaces in organic electronics.

In computer technology, storage media are required which allow rapid writing and reading access to information stored therein. Solid-state memories or semiconductor memories allow particularly fast and reliable storage media to be achieved, since absolutely no moving parts are necessary. At present, use is mainly made of dynamic random access memory (DRAM). DRAM allows rapid access to the stored information, but this information has to be refreshed regularly, meaning that the stored information is lost when the power supply is switched off.

The prior art also discloses non-volatile semiconductor memories, such as flash memory or magnetoresistive random access memory (MRAM), in which the information is retained even after the power supply has been switched off. A disadvantage of flash memory is that writing access takes place comparatively slowly and the memory cells of the flash memory cannot be erased ad infinitum. The lifetime of flash memory is typically limited to a maximum of one million read/write cycles. MRAM can be used in a similar way to DRAM and has a long lifetime, but this type of memory has not been able to establish itself owing to the difficult production process.

A further alternative is memory which works on the basis of memristors. The term memristor is a contraction of the words "memory" and "resistor" and denotes a component which is able to change its electrical resistance reproducibly between high and low electrical resistance. The respective state (high resistance or low resistance) is retained even without a supply voltage, meaning that non-volatile memories can be achieved with memristors.

An important alternative application of electrically switchable components arises for the area of neuromorphic or synaptic computing. In computer architectures pursued therein, the information is no longer intended to be processed sequentially in a classical manner. Instead, the aim is to build up the circuits in a highly three-dimensionally interlinked manner in order to be able to achieve information processing analogous to the brain. In artificial neuronal networks of this type, the biological connections between nerve cells (synapses) are then represented by the memristive switching elements. Under certain circumstances, additional intermediate states (between the digital states "1" and "0") may also be of particular benefit here.

WO 2012/127542 A1 and US 2014/008601 A1, for example, disclose organic molecular memories which have two electrodes and an active region which is arranged between the two electrodes. The active region has a molecular layer of electrically conductive aromatic alkynes, whose conductivity can be modified under the influence of an electric field. Similar components based on redox-active bipyridinium compounds are proposed in US 2005/0099209 A1.

The known memories based on a change in conductivity or resistance have the disadvantage that the free-radical intermediates formed by the flow of current through the molecules of the monolayer are in principle susceptible to degradation processes, which has an adverse effect on the lifetime of the components.

DE102015000120A1 discloses electronic components which are suitable for use in memristive devices. The components contain a self-assembled monolayer of molecules which are able to reorient in an electric field.

An important class of substances which can be aligned in an electric field are mesogenic compounds. Mesogenic compounds are known from the prior art and are compounds which contain one or more mesogenic groups. A mesogenic group is the part of a molecule which, due to the anisotropy of its attractive and repulsive interactions, makes a significant contribution to low-molecular-weight substances forming a liquid-crystalline (LC) mesophase (C. Tschierske, G. Pelzl, S. Diele, Angew. Chem. 2004, 116, 6340-6368). The property that mesogenic compounds which carry polar substituents can be aligned and reoriented in an electric field is utilised in practice in liquid-crystal displays (Klasen-Memmer, M., and Hirschmann, H., 2014. Nematic Liquid Crystals for Display Applications. Handbook of Liquid Crystals. 3: II:4:1-25.)

DE102015000120A1 discloses electronic components which are suitable for use in memristive devices. The components contain a self-assembled monolayer of molecules which are able to reorient in an electric field.

Mesogenic compounds containing a terminal polar anchor group are likewise known in principle from the prior art. JP 2007 177051 A describes mesogenic compounds having positive dielectric anisotropy which are proposed for the derivatisation of iron oxide nanoparticles; the bonding to the particles takes place here through phosphate, phosphonate or carboxylate groups located at the end of the side chain. WO 2013/004372 A1 and WO 2014/169988 A1 disclose mesogenic compounds which carry terminal hydroxyl groups and serve for the derivatisation of substrates for liquid-crystal displays with the aim of homeotropic alignment of the liquid crystal. A corresponding use of dielectrically neutral and positive mesogenic compounds containing polar anchor groups is disclosed in JP2005/002164 A.

The processes described in DE102015000120A1 for the production of SAMs are dip coating or the process known as the T-BAG method, in which the solvent containing the compound to be applied is slowly evaporated (see E. L. Hanson et al., J. Am. Chem. Soc. 2003, 125, 16074-16080). These lengthy processes are not very suitable for commercial use. Industrially usable processes are, in particular, spin coating, furthermore spray coating, slot-die coating, and conventional printing processes, such as, for example, ink-jet printing, screen printing and micro-contact stamp printing. In particular on use of monolayer-forming compounds which contain free acid groups as anchor groups, the problem arises that they are only sufficiently soluble in highly polar solvents, such as, for example, THF, ethanol or iso-propanol. Also, these solvents compete with the monolayer-forming compounds for bonding to the substrates and thus reduce the quality of the monolayers.

An objective of the present invention is to provide an improved process for the production of a memory element.

Another objective of the present invention is to provide compounds which are suitable for the production of memory elements using methods that are conventional in the memory industry.

To solve the problem a process is provided as defined in claim 1.

Specifically, an electrically conductive layer covered by a switchable molecular layer can be formed by the process according to the invention.

The process is distinguished by yielding a molecular layer with high purity since the molecular layer is deposited as a part of an ALD process, thus, contamination of the substrate surface by airborne volatile organic compounds and by impurities or decomposition products in a solvent is avoided.

The process is further distinguished by high efficiency as no change of tool with breaking of vacuum is required between ALD step and deposition of a molecular layer. Moreover, an annealing step is unnecessary and process robustness is improved.

The invention further relates to a substrate comprising an electrically conductive layer operable as an electrode covered by a switchable molecular layer for use in electronic components, in particular in memristive devices, where said substrate is obtainable by the process according to the invention.

According to another aspect of the present invention there is provided an electronic component comprising a substrate comprising a bottom layer operable as a first electrode, an anchoring layer formed using atomic layer deposition; a switchable molecular layer formed using physical vapor deposition, and a top electrode in contact with the molecular layer.

Preferred embodiments are defined in the dependent claims and can be taken from the description.

As used herein, the terms "RRAM" or "resistive memory device" or "memristive device" are taken to mean a memory device that uses a molecular switching layer whose resistance can be can be controlled by applying a voltage.

As used herein, coupon will be understood to mean a smaller section of a substrate.

BRIEF DESCRIPTION OF THE DRAWINGS

FIG. 2 schematically illustrates an exemplary logarithmic plot of measured current (1) values versus applied voltages (V) of an exemplary embodiment of a memory device having a resistive switching memory element.

FIG. 3 shows a schematic illustration of an experimental setup for the electrical characterisation of an electronic switching device according to the invention.

Figure 1A:
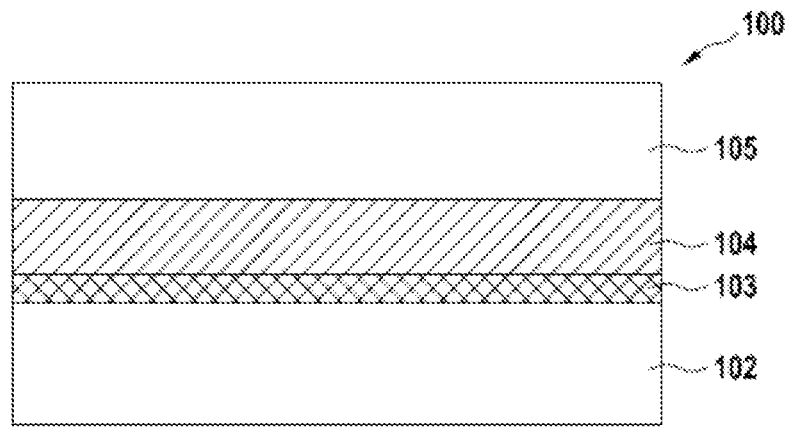
FIG. 1A shows a schematic illustration of the layer structure of a non-volatile memory element.

A process for the in situ deposition of a molecular layer by means of the precursors defined above and below, preferably selected from the compounds of the formulae IA, IB and IC defined below is provided.

The process starts with providing a substrate, optionally comprising a bottom electrode, which is used to optionally deposit a bottom electrode, followed by an anchoring layer and a molecular layer, herein also referred to as resistive switching layer, in later operations. The substrate may include one or more signal lines or contacts, with which the bottom electrode will form an electrical connection during its deposition. The substrate may have a pre-treated surface suitable for ALD.

ALD employs chemisorption to deposit a saturated monolayer of reactive precursor molecules on a substrate surface. This is achieved by alternatingly pulsing appropriate reactive precursors, hereinafter also referred to as first and second reactants, into a deposition chamber. Each injection of a reactive precursor is separated by an inert gas purge to provide a new atomic layer additive to previously deposited layers to form a uniform layer on the substrate. The cycle is repeated to form the layer to a desired thickness.

The basic chemical mechanism active in atomic layer deposition involves two vapor phase reactive chemical species, typically a metal-organic precursor and a co-reactant as an oxygen source or as a reducing agent. The precursor and co-reactant species are transported sequentially into a heated reaction zone containing a receptive growth surface, the substrate, resulting in two time-separated half-reaction steps. Time-separated exposure is ensured by purging the reactor with inert gas between reactant exposure steps. The first precursor exposure step leads to the first ALD half-reaction. In this step, the precursor chemically reacts and bonds to the surface without fully decomposing. The precursor also changes the dominant surface termination, leaving the surface ready to react with the co-reactant. The remaining vapor products are pumped or pushed out of the deposition zone using inert gas flow. For the second ALD half-reaction, the co-reactant is transported to the growth surface where the co-reactant reacts exothermally on the surface. The vapor products are flushed out, and the ALD cycle starts over again.

In an embodiment, the process comprises forming a bottom electrode using ALD. This operation may involve one or more cycles, each involving the following four steps: introducing one or more precursors into the depositing chamber to form an absorbed layer, followed by purging these precursors, and then introducing reactive agents that will react with the absorbed layer to form a portion of or the entire electrode layer, followed by purging the reactive agents. Selection of precursors and processing conditions depend on desired composition, morphology, and structure of each portion of the electrode. A layer formed during each ALD cycle described above may be between about 0.25 and 2 Å thick. In some embodiments, this thickness may not be sufficient for an electrode. The cycle may be repeated multiple times to increase the electrode layer to the desired thickness. In some embodiments, the thickness of the electrode is less than 5 nm or, more specifically, less than 3 nm. The minimum electrode thickness is determined by the resistance of the layer. The requirement of the electrode layer is to be continuous and have a sufficiently low resistance compared to the low-resistance state (LRS) of the switching layer. ALD can deposit a continuous film as low as 1 nm thick that is still reasonable conductive. In some embodiment, electrodes formed from materials that intrinsically contain and capable to release oxygen (e.g., TiN) are formed into even thinner layers to reduce the total amount of oxygen for preventing unwanted oxidization of the switching layer or the interface. In some embodiments, ALD cycles are repeated using different precursors. As such, different portions of the same electrode layer may have different compositions. This approach may be used to deposit, for example, tertiary nitrides, in the form of nano-laminates.

The molecular layer is formed directly on top of a reactive layer generated by an ALD process. This reactive layer is created as an intermediate by the first half-reaction of the ALD process.

Herein, a layer deposited by an ALD process by serially exposing the substrate to first and second reactants, the atomic layer deposition process ending with exposing the substrate to said first reactant to form a reactive surface on said layer is referred to as anchoring layer.

In an embodiment, the anchoring layer is deposited onto the substrate an can serve as bottom electrode.

In another embodiment, the anchoring layer is deposited onto a bottom electrode on the substrate. Herein, the material of the bottom electrode and the anchoring layer can be the same or different.

In the process according to the invention, an anchoring layer is deposited by an ALD process by serially exposing the substrate to first and second reactants, the atomic layer deposition process ending with exposing the substrate to said first reactant to form a reactive surface on said layer. As the ALD process ends after a first half reaction of the ALD cycle, the terminal layer carries a reactive adlayer (reactive surface) consisting of reactive intermediates as for example metal-alkyl, metal-hydride, metal-alkoxy, metal-alkylamino, metal-diketonat, metal-diene, metal-arene, metal-cyclopentadienyl or metal halide groups and their subsequent decomposition products, depending on the nature of the first reactant.

The first and second reactants used in the ALD process according to the invention may be gaseous, liquid, or solid. However, liquid or solid reactants should be sufficiently volatile to allow introduction as a gas. The vapor pressure should be high enough for effective mass transportation. Also, solid and some liquid precursors may need to be heated and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may somewhat vary during the process because of changes in their surface area.

Suitable first and second reactive gases are known to the skilled person and described in the literature, for example in: ALD database [online]. AtomicLimits 2019 [retrieved on 30 Aug. 2019]. Retrieved from https://www.atomiclimits.com/alddatabase/Preferred first reactive gases and suitable second reactive gases are listed in the following table.

| First reactive gas | Second reactive gas |
|---|---|
| Al($^i$PrAMD)Et$_2$ | H$_2$O |
| Al(mmp)$_3$ | H$_2$O |
| Al(NEt$_2$)$_3$ | H$_2$O, O$_3$ |
| Al(N$^i$Pr$_2$)$_2$(C$_3$H$_6$NMe$_2$) | H$_2$O |
| Al(N$^i$Pr$_2$)$_3$ | H$_2$O |
| Al(OEt)$_3$ | H$_2$O, O$_2$ |
| Al(O$^n$Pr)$_3$ | H$_2$O, O$_2$ |
| AlCl$_3$ | H$_2$O, O$_2$, ROH Al(OEt)$_3$ Al(O$^i$Pr)$_3$ |
| AlEt$_3$ | H$_2$O |
| AlH$_3$N:(C$_5$H$_{11}$) | O$_2$ plasma |
| AlMe$_2$(C$_3$H$_6$NMe$_2$) | O$_2$ Plasma |
| AlMe$_2$Cl | H$_2$O |
| AlMe$_2$O$^i$Pr | H$_2$O, O$_2$ plasma |
| AlMe$_3$ | H$_2$O, H$_2$O$_2$, O$_3$, O$_2$ plasma, O$_2$ + H$_2$O + H$_2$O$_2$ CO$_2$ plasma N$_2$O NO$_2$ N$_2$O$_4$ $^i$PrOH $^n$PrOH Al(O$^i$Pr)$_3$ |
| Zr(Cp$_2$CMe$_2$)Me(OMe) | O$_3$ |
| Zr(Cp$_2$CMe$_2$)Me$_2$ | O$_3$ |
| Zr(CpEt)(NMe$_2$)$_3$ | O$_3$ |
| Zr(CpMe)(NMe$_2$)$_3$ | O$_3$ |
| Zr(CpMe)$_2$Me(OMe) | H$_2$O O$_3$ |
| Zr(CpMe)$_2$Me$_2$ | O$_3$ |
| Zr(CpMe)CHT | O$_3$ |
| Zr(dmae)$_4$ | H$_2$O |
| Zr(MeAMD)$_4$ | H$_2$O |
| Zr(NEt$_2$)$_4$ | H$_2$O, O$_2$ O$_2$ plasma |
| Zr(NEtMe)$_4$ | H$_2$O, O$_3$, O$_2$ plasma, N$_2$O plasma |
| Zr(NMe$_2$)$_4$ | H$_2$O |
| Zr(O$^i$Pr)$_2$(dmae)$_2$ | H$_2$O |
| Zr(O$^i$Pr)$_4$ | H$_2$O |
| Zr(O$^t$Bu)$_2$(dmae)$_2$ | H$_2$O, H$_2$ plasma |
| Zr(O$^t$Bu)$_4$ | H$_2$O O$_2$ O$_2$ plasma N$_2$O Ar plasma |
| Zr(thd)$_4$ | O$_3$ |
| Zr[N(SiMe$_3$)$_2$]$_2$Cl$_2$ | H$_2$O |
| ZrCl$_4$ | H$_2$O, H$_2$O$_2$, O$_2$ |
| ZrCp(NMe$_2$)$_3$ | O$_3$ |
| ZrCp$_2$Cl$_2$ | O$_3$ |
| ZrCp$_2$Me(OMe) | O$_3$ |
| ZrCp$_2$Me$_2$ | H$_2$O, O$_3$ |
| ZrI$_4$ | H$_2$O H$_2$O$_2$ |
| [Hf{η$_2$-($^i$PrN)$_2$CNEtMe}(NEtMe)$_3$] | H$_2$O, O$_2$, plasma |
| Hf(Cp)(NMe$_2$)$_3$ | O$_3$ |
| Hf(Cp$_2$CMe$_2$)Me(OMe) | O$_3$ |
| Hf(Cp$_2$CMe$_2$)Me$_2$ | O$_3$ |
| Hf(CpMe)(NMe$_2$)$_3$ | O$_3$ |
| Hf(CpMe)$_2$(mmp)Me | H$_2$O |
| Hf(CpMe)$_2$(O$^i$Pr)Me | H$_2$O |
| Hf(CpMe)$_2$(OMe)Me | H$_2$O, O$_3$ |
| Hf(CpMe)$_2$Me$_2$ | H$_2$O, O$_3$ |
| Hf(mmp)$_4$ | H$_2$O |
| Hf(mp)$_4$ | H$_2$O, O$_2$ plasma |
| Hf(NEt$_2$)$_4$ | H$_2$O, O$_2$, O$_2$ plasma, O$_3$, N$_2$O, N$_2$O plasma |
| Hf(NEtMe)$_4$ | H$_2$O, O$_3$, O$_2$ plasma, N$_2$O plasma |
| Hf(NMe$_2$)$_4$ | H$_2$O, O$_3$, O$_2$, O$_2$ plasma |
| Hf(NO$_3$)$_4$ | H$_2$O |
| Hf(O$^i$Pr)$_4$ | O$_2$ |
| Hf(ONEt$_2$)$_4$ | H$_2$O |
| Hf(O$^t$Bu)(NEtMe)$_3$ | O$_3$ |
| Hf(O$^t$Bu)$_2$(mmp)$_2$ | H$_2$O O$_2$ |
| Hf(O$^t$Bu)$_4$ | H$_2$O, O$_3$, O$_2$, O$_2$ plasma, HCOOH, CH$_3$COOH |
| Hf[N(SiMe$_3$)$_2$]$_2$Cl$_2$ | H$_2$O |
| HfCl$_2$[N(SiMe$_3$)$_2$]$_2$ | H$_2$O |
| HfCl$_4$ | H$_2$O, O$_2$, O$_3$, Hf(mmp)$_4$ |
| HfCp$_2$Cl$_2$ | H$_2$O, O$_3$ |
| HfCp$_2$Me$_2$ | H$_2$O, O$_3$ |
| HfI$_4$ | H$_2$O, H$_2$O$_2$, O$_2$ |
| Cr(Me$^t$BuCOCN$^t$Bu)$_2$ | BH$_3$(NHMe$_2$) |
| CCTBA | H$_2$ plasma |
| Co(Cp)$_2$ | N$_2$/H$_2$ plasma |
| Co(CpMe)$_2$ | NH$_3$ plasma |
| Co($^i$PrAMD)$_2$ | H$_2$ |
| Co($^i$PrAMD)$_2$ | NH$_3$ |
| Co($^i$PrAMD)$_2$ | NH$_3$ plasma |
| Co(Me$^i$PrCOCN$^t$Bu)$_2$ | BH$_3$(NHMe$_2$) |
| Co($^t$Bu$_2$DAD)$_2$ | HCOOH |
| Co($^t$Bu$_2$DAD)$_2$ | $^t$BuNH$_2$ |
| Co($^t$Bu$_2$DAD)$_2$ | Et$_2$NH |
| CO$_2$(CO)$_8$ | H$_2$ plasma |
| CO$_2$(CO)$_8$ | N$_2$ plasma |
| CoCp(CO)$_2$ | NH$_3$ plasma |
| CoCp(CO)$_2$ | H$_2$ plasma |
| CoCp(CO)$_2$ | N$_2$ plasma |
| CoCp($^i$PrAMD) | NH$_3$ plasma |
| CoCp$_2$ | NH$_3$ plasma |
| WF$_6$ | Si$_2$H$_6$, B$_2$H$_6$ |

The reactive layer is reacted with one or more compounds suitable for the formation of the molecular layer, and which comprise a reactive anchoring group. The reaction takes place in the vapour-phase at temperatures in the range of from 100° C. to 400° C. The compounds are applied either by direct evaporation (pulsed or continuously) or through a carrier gas stream to the activated surface.

The compounds are organic compounds of flexible conformation and have a conformation-flexible molecular dipole moment and a reactive anchoring group G.

As used herein, a reactive anchoring group is taken to mean a functional group capable of reacting with the reactive surface obtained by the process according to claim 1. In particular, the reactive anchoring group is capable of reacting with a reactive surface comprising intermediate species selected from, but not limited to, the group of metal-alkyl, metal-hydride, metal-alkoxy, metal-alkylamino, metal-diketonat, metal-diene, metal-arene, metal-cyclopentadienyl or metal halide groups. The skilled person knows suitable functional groups depending on the nature of the reactive surface. Examples are amines, thiols, alcohols, phosphonic acids, carboxylic acids and their derivatives.

The compounds for the formation of the molecular layer are preferably selected from compounds of the formula I $$G\text{-}Sp\text{-}(D)_{0,1}\text{-}E \qquad (I)$$

in which G denotes a reactive anchoring group for reacting with the reactive surface of the anchoring layer. The compounds (I) further may contain a spacer group (Sp) to connect the molecules with the anchoring group, optionally an intermediate group (D) and a polar group (E), where the molecules can adopt different conformations and have a conformation-dependent molecular dipole moment due to the polar group.

The intermediate group is a cyclic organic group which is preferably mesogenic and can be polar or non-polar.

The spacer group (Sp) is of flexible conformation, enabling the molecules to adopt different conformations and meaning that they have a conformation-dependent molecular dipole moment. "Of flexible conformation" means that the spacer group (Sp) is selected in such a way that it can adopt at least two different conformations.

The polar group is generally selected in such a way that it provides the molecule with a permanent dipole moment of at least 0.5 Debye. The permanent dipole moment is preferably greater than 2 Debye and particularly preferably greater than 3 Debye.

The polar group is preferably a group which has at least one bond in which the electronegativity difference between the atoms involved is at least 0.5, where the electronegativity values are determined by the Pauling method.

Preference is given to polar groups selected from CN, SCN, NO$_2$, (C$_1$-C$_4$)-haloalkyl, preferably CF$_3$; (C$_1$-C$_4$)-haloalkoxy, preferably OCF$_3$; S(C$_1$-C$_4$)-haloalkyl, preferably SCF$_3$; S(O)$_2$—(C$_1$-C$_4$)-haloalkyl, preferably SO$_2$CF$_3$; SF$_5$, OSF$_5$, N(C$_1$-C$_4$-haloalkyl)$_2$, preferably N(CF$_3$)$_2$; N(CN)$_2$ and (C$_6$-C$_{12}$)-haloaryl, preferably mono-, di- or trifluorophenyl.

Preferred reactive anchoring groups are alkylcarbonates, alcohols and silylated alcohols, very preferably alcohols and silylated alcohols.

In a preferred embodiment of the present invention, the molecular layer is formed from one or more compounds selected from the group of compounds of the formulae IA, IB and IC:

$$R^{1A}\text{-}(A^1\text{-}Z^1)_r\text{-}B^1\text{—}(Z^2\text{-}A^2)_s\text{-}Sp^A\text{-}G \qquad (IA)$$

$$D^1\text{-}Z^D\text{-}(A^1\text{-}Z^1)_r\text{-}B^1\text{—}(Z^2\text{-}A^2)_s\text{-}Sp\text{-}G \qquad (IB)$$

$$R^{1C}\text{-}(A^1\text{-}Z^1)_r\text{-}B^1\text{—}Z^L\text{-}A^{2C}\text{-}(Z^3\text{-}A^3)_s\text{-}Sp^C\text{-}G \qquad (IC)$$

in which $R^{1A}$, $R^{1C}$ denote straight chain or branched alkyl or alkoxy each having 1 to 20 C atoms, where one or more CH$_2$ groups in these radicals may each be replaced, independently of one another, by —O=O—, —CH=CH—,

—O—, —S—, —CF$_2$O—,

—OCF$_2$—, —CO—O—, —O—CO—, —SiR$^o$R$^{oo}$—, —NH—, —NR$^o$— or —SO$_2$— in such a way that O atoms are not linked directly to one another, and in which one or more H atoms may be replaced by halogen, CN, SCN or SF$_5$, where $R^{1C}$ alternatively denotes a group $D^1$-$Z^D$, $Z^D$ has one of the meanings of $Z^1$, $Z^2$ and $Z^3$ or denotes a spacer group, $Z^1$, $Z^2$, $Z^3$ on each occurrence, identically or differently, denote a single bond, —CF$_2$O—, —OCF$_2$—, —CF$_2$S—, —SCF$_2$—, —CH$_2$O—, —OCH$_2$—, —C(O)O—, —OC(O)—, —C(O)S—, —SC(O)—, —(CH$_2$)$_{n1}$—, —(CF$_2$)$_{n2}$—, —CF$_2$—CH$_2$—, —CH$_2$—CF$_2$—, —CH=CH—, —CF=CF—, —CF=CH—, —CH=CF—, —(CH$_2$)$_{n3}$O—, —O(CH$_2$)$_{n4}$—, —C≡C—, —O—, —S—, —CH=N—, —N=CH—, —N=N—, —N=N(O)—, —N(O)=N— or —N=C—C=N—, n1, n2, n3, n4 identically or differently, are 1, 2, 3, 4, 5, 6, 7, 8, 9 or 10, $Z^L$ denotes —O—, —S—, —CH$_2$—, —C(O)—, —CF$_2$—, —CHF—, —C(R$^x$)$_2$—, —S(O)—, —SO$_2$—, G denotes optionally silylated OH, or straight chain or branched alkyl having 1 to 12 C atoms in which one, two or three not geminal H atoms are substituted by optionally silylated OH; or an alkyl carbonate in which alkyl is straight chain or branched alkyl having 1 to 12 C atoms, preferably tertiary alky; or trialkylsilylcarbonate, in which alkyl denotes alkyl having 1 to 6 C atoms, preferably n-alkyl, very preferably methyl ethyl or isopropyl, $D^1$ denotes a diamondoid radical, preferably derived from a lower diamondoid, very preferably selected from the group consisting of adamantyl, diamantyl, and triamantyl, in which one or more H atoms can be replaced by F, in each case optionally fluorinated alkyl, alkenyl or alkoxy having up to 12 C atoms, in particular

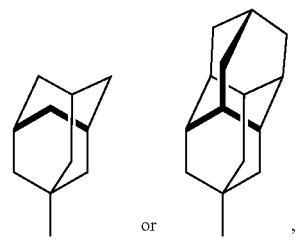

$A^1$, $A^2$, $A^3$ on each occurrence, identically or differently, denote an aromatic, heteroaromatic, alicyclic or heteroaliphatic ring having 4 to 25 ring atoms, which may also contain condensed rings and which may be mono- or polysubstituted by Y, $A^{2C}$ denotes an aromatic or heteroaromatic ring having 5 to 25 ring atoms, which may also contain condensed rings and which may be mono- or polysubstituted by $Y^C$, Y on each occurrence, identically or differently, denotes F, Cl, CN, SCN, $SF_5$ or straight-chain or branched, in each case optionally fluorinated alkyl, alkoxy, alkylcarbonyl, alkoxycarbonyl, alkylcarbonyloxy or alkoxycarbonyloxy having 1 to 12 C atoms, preferably F or C, $Y^C$ on each occurrence, identically or differently, denotes F, C, CN, SCN, $SF_5$ or straight-chain or branched, in each case optionally fluorinated alkyl, alkoxy, alkylcarbonyl, alkoxycarbonyl, alkylcarbonyloxy or alkoxycarbonyloxy having 1 to 12 C atoms, or cycloalkyl or alkylcycloalkyl each having 3 to 12 C atoms, preferably methyl, ethyl, isopropyl, cyclopropyl, cyclobutyl, cyclopentyl, cyclohexyl, trifluoromethyl, methoxy or trifluoromethoxy, $B^1$ denotes

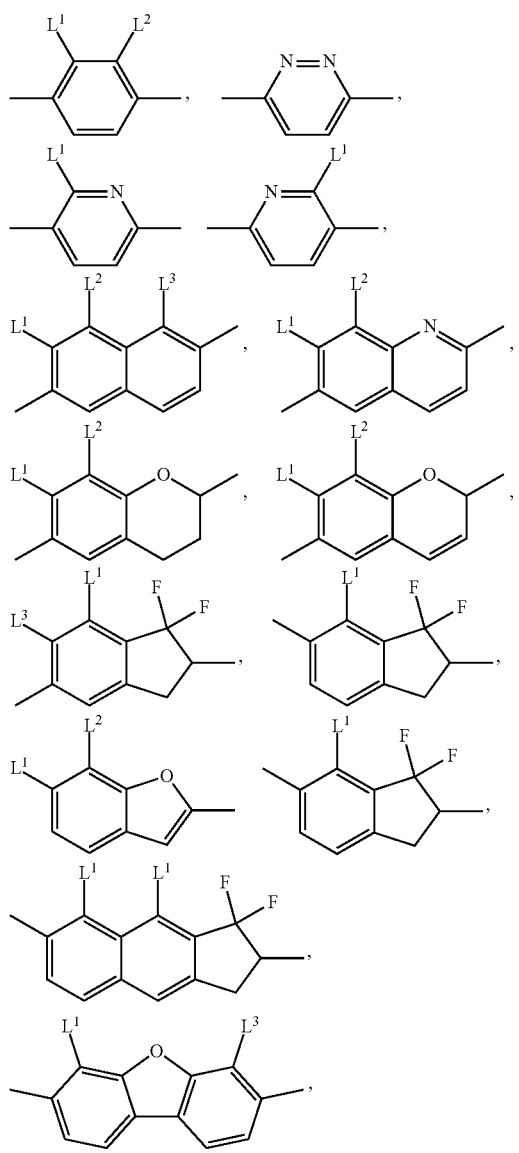

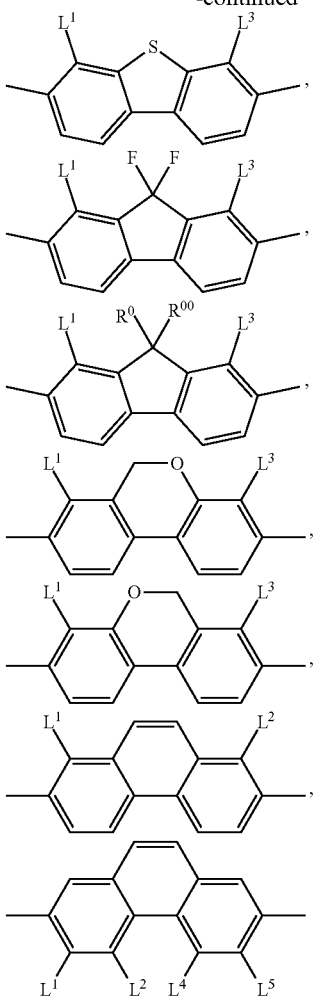

where the groups may be oriented in both directions, $L^1$ to $L^5$, independently of one another, denote F, Cl, Br, I, CN, $SF_5$, $CF_3$ or $OCF_3$, preferably Cl or F, where $L^3$ may alternatively also denote H, $Sp^A$ denotes a spacer group or a single bond, preferably a spacer group, Sp denotes a spacer group or a single bond, $Sp^C$ denotes a spacer group or a single bond, preferably a single bond, $R^0$, $R^{00}$, identically or differently, denote an alkyl or alkoxy radical having 1 to 15 C atoms, in which, in addition, one or more H atoms may be replaced by halogen, $R^x$ denotes straight-chain or branched alkyl having 1 to 6 C atoms, and r, s on each occurrence, identically or differently, are 0, 1 or 2.

In a preferred embodiment, the anchoring group G of the compounds forming the molecular layer, in particular of the compounds of the formulae IA, IB and IC and their sub-formulae, is selected from OH,

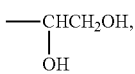

—CH(CH$_2$OH)$_2$, —COOH, and —O—C(O)—OR$^2$, in which R$^2$ denotes primary or secondary or tertiary alkyl having 1 to 6 C atoms, preferably tert.-butyl, Very preferably, the anchoring group G is selected from the group consisting of OH,

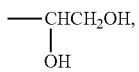

—CH(CH$_2$OH)$_2$ and —COOH.

According to another preferred embodiment of the present invention there is provided a process in which the first reactant of the ALD process has fluorine atoms associated therewith and wherein the anchoring group G of the compounds forming the molecular layer, in particular of the compounds of the formulae IA, IB and IC and their subformulae, is selected from —OSiR$_3$, —COOSiR$_3$, —CH(CH$_2$OSiR$_3$)$_2$,

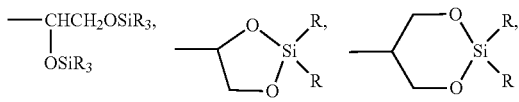

and —O—C(O)—OSiR$_3$, in which R, on each occurrence, identically or differently, denotes alkyl having 1 to 6 C atoms, preferably methyl, ethyl or isopropyl, very preferably methyl.

The term "diamondoids" refers to substituted and unsubstituted cage compounds of the adamantane series including adamantane, diamantane, triamantane, tetramantanes, pentamantanes, hexamantanes, heptamantanes, octamantanes, and the like, including all isomers and stereoisomers thereof. The compounds have a "diamondoid" topology, which means their carbon atom arrangement is superimposable on a fragment of a face centred cubic diamond lattice. Substituted diamondoids from the first of the series are preferable with 1 to 4 independently-selected alkyl or alkoxy substituents. Diamondoids include "lower diamondoids" and "higher diamondoids," as these terms are defined herein, as well as mixtures of any combination of lower and higher diamondoids. The term "lower diamondoids" refers to adamantane, diamantane and triamantane and any and/or all unsubstituted and substituted derivatives of adamantane, diamantane and triamantane. These lower diamondoid components show no isomers or chirality and are readily synthesized, distinguishing them from "higher diamondoids." The term "higher diamondoids" refers to any and/or all substituted and unsubstituted tetramantane components; to any and/or all substituted and unsubstituted pentamantane components; to any and/or all substituted and unsubstituted hexamantane components; to any and/or all substituted and unsubstituted heptamantane components; to any and/or all substituted and unsubstituted octamantane components; as well as mixtures of the above and isomers and stereoisomers of tetramantane, pentamantane, hexamantane, heptamantane, and octamantane. Adamantane chemistry has been reviewed by Fort, Jr. et al. in "Adamantane: Consequences of the Diamondoid Structure," Chem. Rev. vol. 64, pp. 277-300 (1964). Adamantane is the smallest member of the diamondoid series and may be thought of as a single cage crystalline subunit. Diamantane contains two subunits, triamantane three, tetramantane four, and so on. While there is only one isomeric form of adamantane, diamantane, and triamantane, there are four different isomers of tetramantane, (two of which represent an enantiomeric pair), i.e., four different possible ways or arranging the four adamantane subunits. The number of possible isomers increases nonlinearly with each higher member of the diamondoid series, pentamantane, hexamantane, heptamantane, octamantane, etc. Adamantane, which is commercially available, has been studied extensively. The studies have been directed toward a number of areas, such as thermodynamic stability, functionalization, and the properties of adamantane-containing materials. For instance, Schreiber et al., New J. Chem., 2014, 38, 28-41 describes the synthesis and application of functionalized diamondoids to form large area SAMs on silver and gold surfaces. In K. T. Narasimha et al., Nature Nanotechnology 11, March 2016 page 267-273, monolayers of diamondoids are described to effectively confer enhanced field emission properties to metal surfaces due to a significant reduction of the work function of the metal.

A spacer group in the sense of the present invention is a flexible chain between dipolar moiety and anchor group which causes a separation between these sub-structures and, owing to its flexibility, at the same time improves the mobility of the dipolar moiety after bonding to a substrate.

The spacer group can be branched or straight chain. Chiral spacers are branched and optically active and non-racemic.

Halogen is F, Cl, Br or I, preferably F or Cl.

Herein, alkyl is straight-chain or branched and has 1 to 15 C atoms, is preferably straight-chain and has, unless indicated otherwise, 1, 2, 3, 4, 5, 6 or 7 C atoms and is accordingly preferably methyl, ethyl, propyl, butyl, pentyl, hexyl or heptyl.

Herein, an alkoxy radical is straight-chain or branched and contains 1 to 15 C atoms. It is preferably straight-chain and has, unless indicated otherwise, 1, 2, 3, 4, 5, 6 or 7 C atoms and is accordingly preferably methoxy, ethoxy, propoxy, butoxy, pentoxy, hexoxy or heptoxy.

Herein, an alkenyl radical is preferably an alkenyl radical having 2 to 15 C atoms, which is straight-chain or branched and contains at least one C—C double bond. It is preferably straight-chain and has 2 to 7 C atoms. Accordingly, it is preferably vinyl, prop-1- or -2-enyl, but-1-, -2- or -3-enyl, pent-1-, -2-, -3- or -4-enyl, hex-1-, -2-, -3-, -4- or -5-enyl, hept-1-, -2-, -3-, -4-, -5- or -6-enyl. If the two C atoms of the C—C double bond are substituted, the alkenyl radical can be in the form of E and/or Z isomer (trans/cis). In general, the respective E isomers are preferred. Of the alkenyl radicals, prop-2-enyl, but-2- and -3-enyl, and pent-3- and -4-enyl are particularly preferred.

Herein alkynyl is taken to mean an alkynyl radical having 2 to 15 C atoms, which is straight-chain or branched and contains at least one C—C triple bond. 1- and 2-propynyl and 1-, 2- and 3-butynyl are preferred.

In the formulae IA, IB and IC, preferred aryl groups are derived, for example, from the parent structures benzene, naphthalene, tetrahydronaphthalene, 9,10-dihydrophen-anthrene, fluorene, indene and indane.

In the formulae IA, IB and IC, preferred heteroaryl groups are, for example, five-membered rings, such as, for example, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole and 1,3,4-thiadiazole, six-membered rings, such as, for example, pyridine, pyridazine, pyrimidine, pyrazine, 1,3,5-triazine, 1,2,4-triazine and 1,2,3-triazine, or condensed rings, such as, for example, indole, isoindole, indolizine, indazole, benzimidazole, benzotriazole, purine, naphthimidazole, benzoxazole, naphthoxazole, benzothiazole, benzofuran, isobenzofuran, dibenzofuran, thieno[2,3b]thiophene, thieno[3,2b]thiophene, dithienothiophene, isobenzothiophene, dibenzothiophene, benzothiadiazothiophene, 2H-chromen (2H-1-benzopyran), 4H-chromene (4H-1-benzopyran) and coumarin (2H-chromen-2-one), or combinations of these groups.

In the formulae IA, IB and IC, preferred cycloaliphatic groups are cyclobutane, cyclopentane, cyclohexane, cyclohexene, cycloheptane, decahydronaphthalene, bicyclo[1.1.1]pentane, bicyclo[2.2.2]octane, spiro[3.3]heptane and octahydro-4,7-methanoindane.

In the formulae IA, IB and IC, preferred heteroaliphatic groups are tetrahydrofuran, dioxolane, tetrahydrothiofuran, pyran, dioxane, dithiane, silinane, piperidine and pyrrolidine.

$A^1$ and $A^2$, independently of one another and identically or differently on each occurrence, are particularly preferably selected from the following groups:
  a) 1,4-phenylene, in which, in addition, one or two CH groups may be replaced by N and in which, in addition, one or more H atoms may be replaced by Y,
  b) the group consisting of trans-1,4-cyclohexylene and 1,4-cyclohexenylene, in which, in addition, one or more non-adjacent $CH_2$ groups may be replaced by —O— and/or —S— and in which, in addition, one or more H atoms may be replaced by Y, and
  c) the group consisting of 1,3-dioxolane-2,4-diyl, tetrahydrofuran-2,5-diyl, cyclobutane-1,3-diyl, 1,4-bicyclo[2.2.2]octanediyl, piperidine-1,5-diyl and thiophene-2,5-diyl, in which, in addition, one or more H atoms may be replaced by Y, where Y has the meaning indicated above under formula IA and preferably denotes F, Cl, CN or $CF_3$.

Preferred spacer groups Sp are selected from the formula Sp'-X', so that the radical G-Sp- of formula IA corresponds to the formula G-Sp'-X'—, and so that the radical $D^1$-Sp- of formula IB corresponds to the formula $D^1$-Sp'-X', and so that in case $Z^D$ of formula IC denotes a spacer group the radical Dia-$Z^D$— of formula IC corresponds to the formula Dia-Sp'-X'—, where
  Sp' denotes straight-chain or branched alkylene having 1 to 20, preferably 1 to 12 C atoms, which is optionally mono- or polysubstituted by F, Cl, Br, I or CN and in which, in addition, one or more non-adjacent $CH_2$ groups may each be replaced, independently of one another, by —O—, —S—, —NH—, —$NR^0$—, —$SiR^{00}R^{000}$—, —CO—, —COO—, —OCO—, —OCO—O—, —S—CO—, —CO—S—, —$NR^{00}$—CO—O—, —O—CO—$NR^0$—, —$NR^0$—CO—$NR^0$—, —CH=CH— or —C≡C— in such a way that O and/or S atoms are not linked directly to one another,
  X' denotes —O—, —S—, —CO—, —COO—, —OCO—, —O—COO—, —CO—$NR^{00}$—, —$NR^{00}$—CO—, —$NR^{00}$—CO—$NR^{00}$—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH=N—, —N=CH—, —N=N—, —CH=$CR^{00}$—, —$CY^x$=$CY^x$—, —C≡C—, —CH=CH—COO—, —OCO—CH=CH— or a single bond,
  $R^0$, $R^{00}$ and $R^{000}$ each, independently of one another, denote H or alkyl having 1 to 12 C atoms, and
  $Y^x$ and $Y^x$ each, independently of one another, denote H, F, Cl or CN.

X' is preferably —O—, —S—, —CO—, —COO—, —OCO—, —O—COO—, —CO—$NR^0$—, —$NR^0$—CO—, —$NR^0$—CO—$NR^0$— or a single bond.

Preferred groups Sp' are —$(CH_2)_{p1}$—, —$(CF_2)_{p1}$—, —$(CH_2CH_2O)_{q1}$—$CH_2CH_2$—, —$(CF_2CF_2O)_{q1}$—$CF_2CF_2$—, —$CH_2CH_2$—S—$CH_2CH_2$—, —$CH_2CH_2$—NH—$CH_2CH_2$— or —$(SiR^{00}R^{000}$—$O)_{p1}$—, in which p1 is an integer from 1 to 12, q1 is an integer from 1 to 3, and $R^{00}$ and $R^{000}$ have the meanings indicated above.

Particularly preferred groups —X'—Sp'- are —$(CH_2)_{p1}$—, —O—$(CH_2)_{p1}$—, —$(CF_2)_{p1}$—, —O$(CF_2)_{p1}$—, —OCO—$(CH_2)_{p1}$— and —OC(O)O—$(CH_2)_{p1}$—, in which p1 has the meaning indicated above.

Particularly preferred groups Sp' are, for example, in each case straight-chain ethylene, propylene, butylene, pentylene, hexylene, heptylene, octylene, nonylene, decylene, undecylene, dodecylene, octadecylene, perfluoroethylene, perfluoropropylene, perfluorobutylene, perfluoropentylene, perfluorohexylene, perfluoroheptylene, perfluorooctylene, perfluorononylene, perfluorodecylene, perfluoroundecylene, perfluorododecylene, perfluorooctadecylene, ethyleneoxyethylene, methyleneoxy-butylene, ethylenethioethylene, ethylene-N-methyliminoethylene, 1-methylalkylene, ethenylene, propenylene and butenylene.

Particularly preferred groups X' are —O— or a single bond.

Particularly preferred sub-formulae of the formula IA are the sub-formulae IAa to IAf shown below:

$R^{1.4}$—$B^1$-$Sp^4$-G      IAa $R^{1.4}$-$(A^1$-$Z^1)$—$B^1$—$Sp^4$-G      IAb $R^{1.4}$-$(A^1$-$Z^1)_2$—$B^1$—$Sp^4$-G      IAc $R^{1.4}$—$B^1$—$(Z^2$-$A^2)$-$Sp^4$-G      IAd $R^{1.4}$—$B^1$—$(Z^2$-$A^2)_2$-$Sp^4$-G      IAe $R^{1.4}$-$(A^1$-$Z^1)$—$B^1$—$(Z^2$-$A^2$-$)$-$Sp^4$-G      IAf in which $R^{1.4}$, $A^1$, $A^2$, $B^1$, $Z^1$, $Z^2$, $Sp^4$ and G have the meanings indicated above and preferably $A^1$ and $A^2$ denote

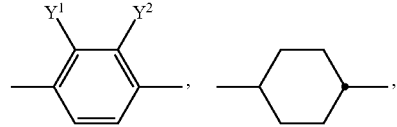

$B^1$ denotes

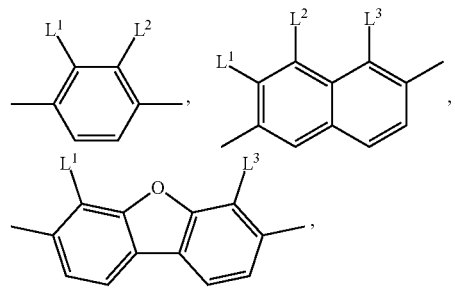

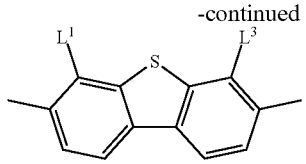

where the groups may be oriented in both directions, $R^{1A}$ denotes alkyl having 1-15 C atoms, preferably having 1-7 C atoms, in particular $CH_3$, $C_2H_5$, n-$C_3H_7$, n-$C_4H_9$, n-$C_5H_{11}$, n-$C_6H_{13}$ or n-$C_7H_{15}$, $L^1$ and $L^2$, independently of one another, denote $CF_3$, Cl or F, where at least one of the radicals $L^1$ and $L^2$ denotes F, $L^3$ denotes F, $Y^1$ and $Y^2$, independently of one another, denote H, Cl or F, $Z^1$, $Z^2$, independently of one another, denote a single bond, —$CF_2O$—, —$OCF_2$—, —$CH_2O$—, $OCH_2$— or —$CH_2CH_2$—, $Sp^4$ denotes unbranched 1,ω-alkylene having 1 to 12 C atoms, G denotes —OH or —$OSiMe_3$ or $OSiEt_3$.

Very particularly preferred sub-formulae of the formula IA are the sub-formulae IAa, IAb and IAd.

Examples of preferred compounds of the formulae IAa to IAf are shown below:

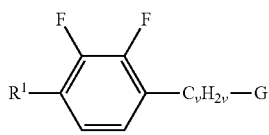
IAa-1

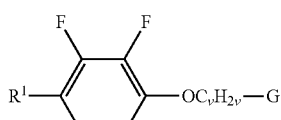
IAa-2

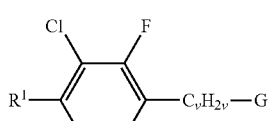
IAa-3

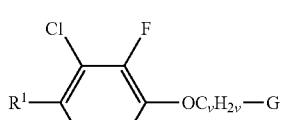
IAa-4

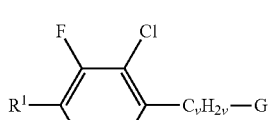
IAa-5

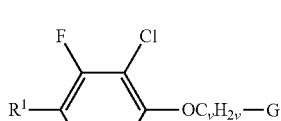
IAa-6

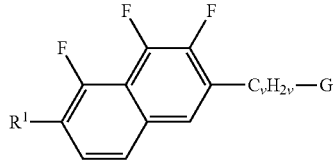
IAa-7

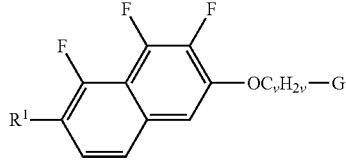
IAa-8

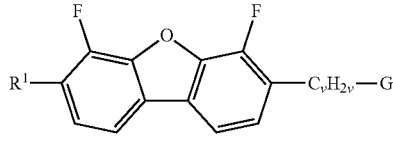
IAa-9

IAa-10

IAa-11

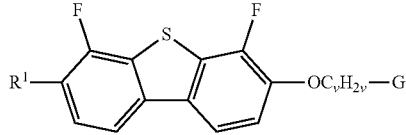
IAa-12

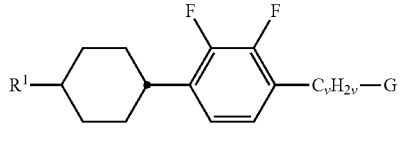
IAb-1

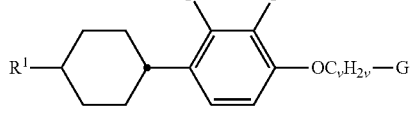
IAb-2

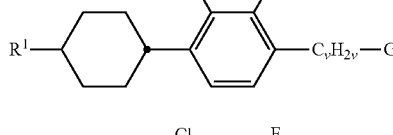
IAb-3

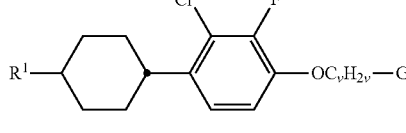
IAb-4

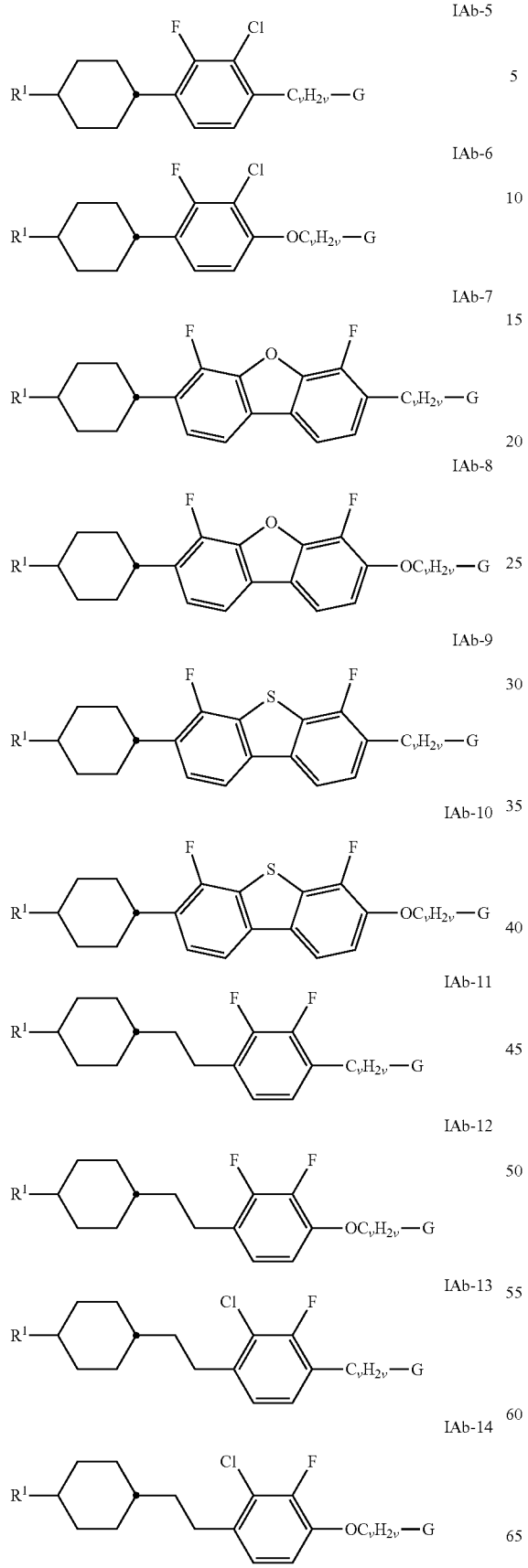
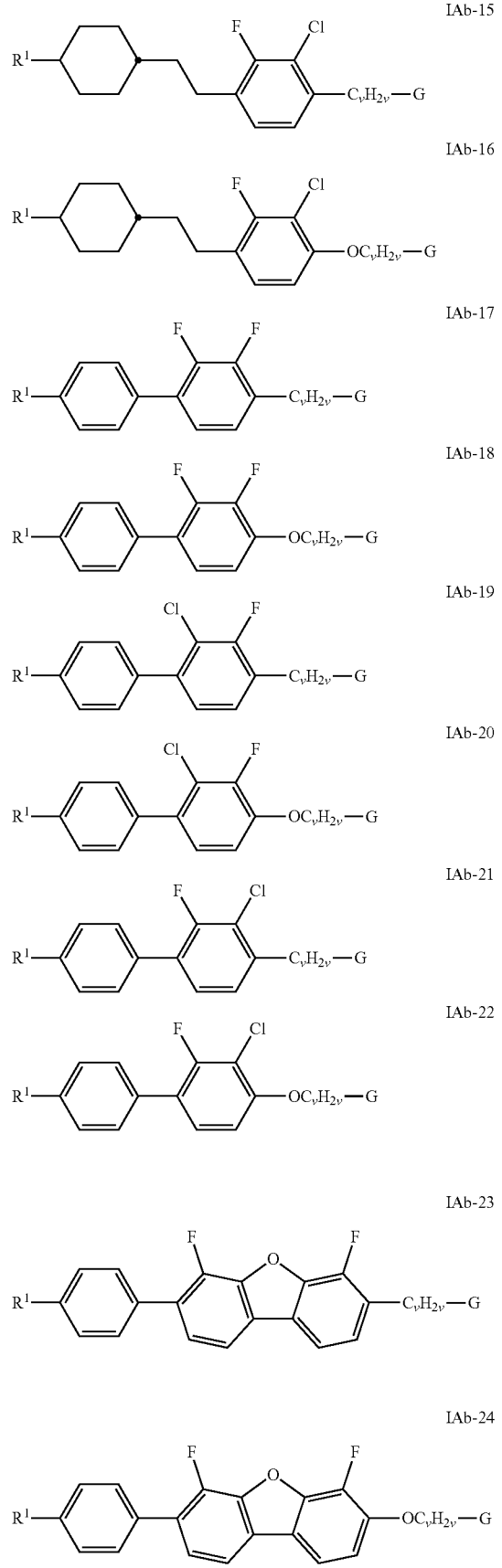

IAb-25
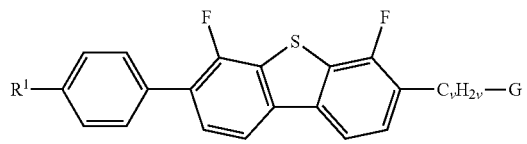
IAb-26
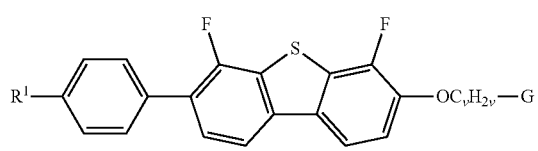
IAb-27
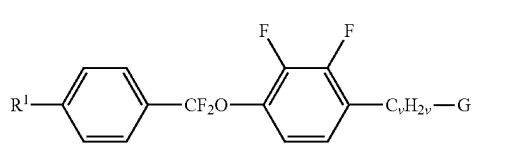
IAb-28
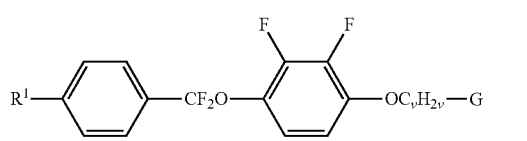
IAb-29
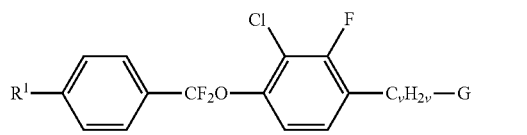
IAb-30
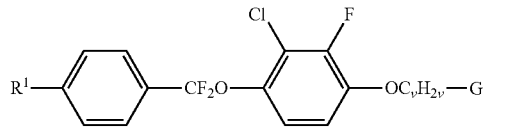
IAb-31
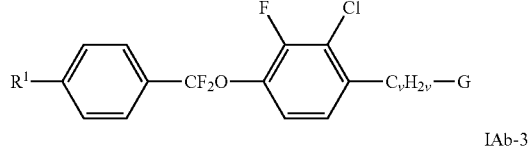
IAb-32
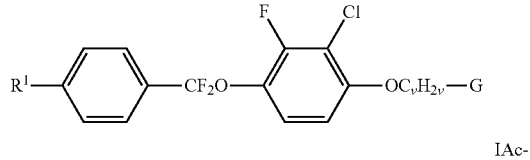
IAc-1
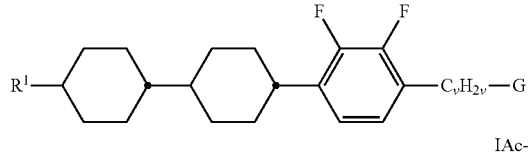
IAc-2
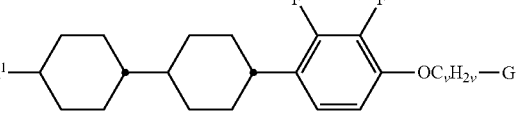
IAc-3
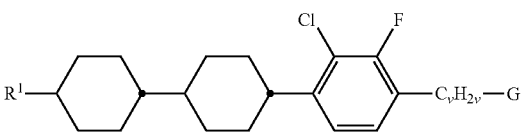
IAc-4
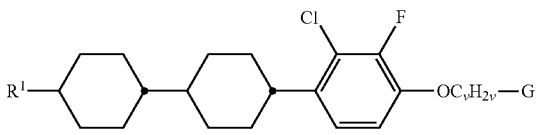
IAc-5
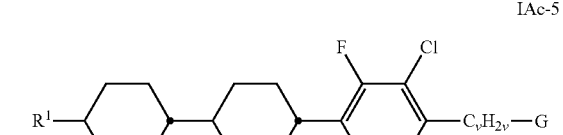
IAc-6
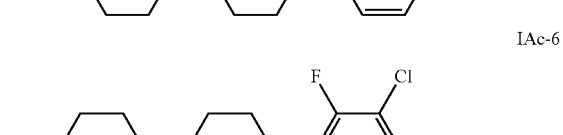
IAc-7
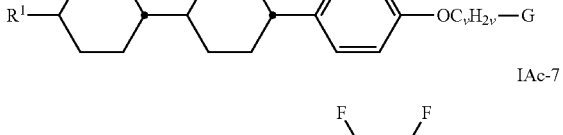
IAc-8
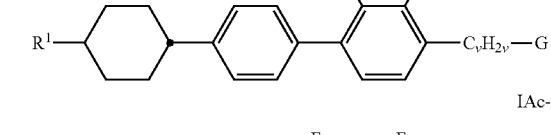
IAc-9
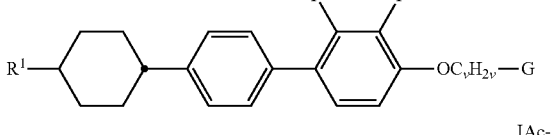
IAc-10
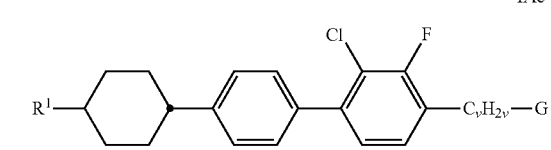
IAc-11
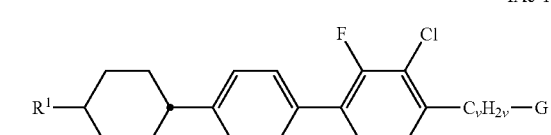
IAc-12
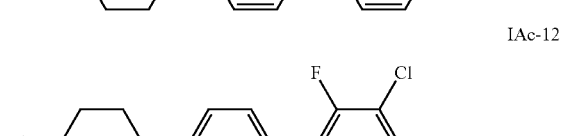

IAc-13
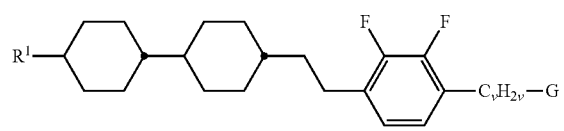
IAc-14
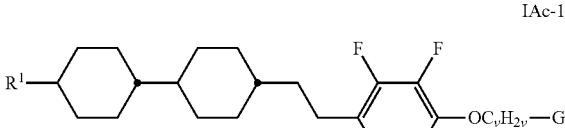
IAc-15
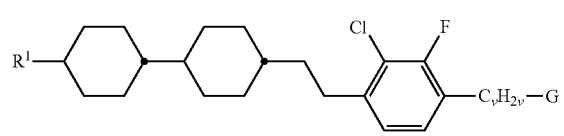
IAc-16
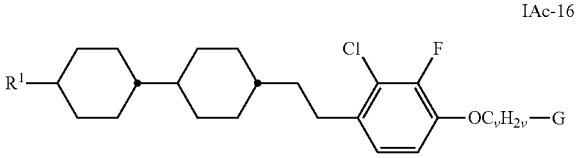
IAc-17
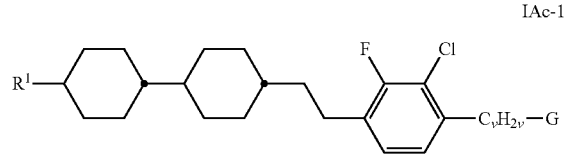
IAc-18
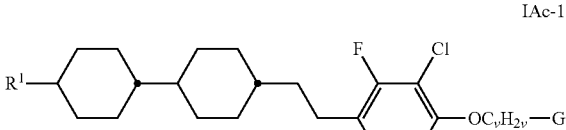
IAc-19
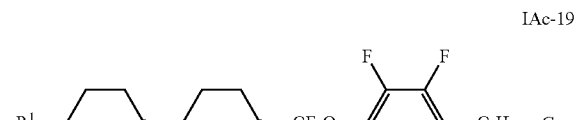
IAc-20
IAc-21
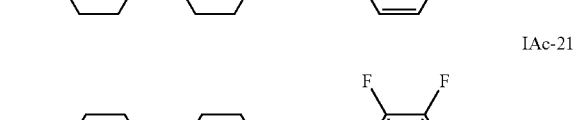
IAc-22
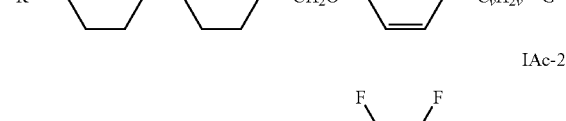
IAc-23
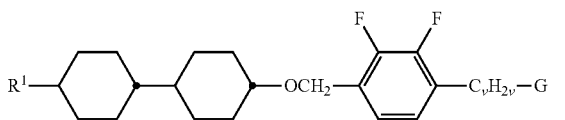
IAc-24
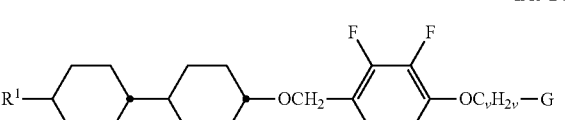
IAc-25
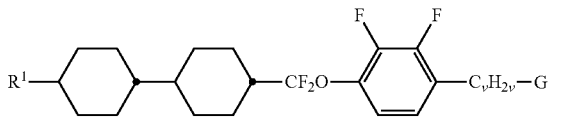
IAc-26
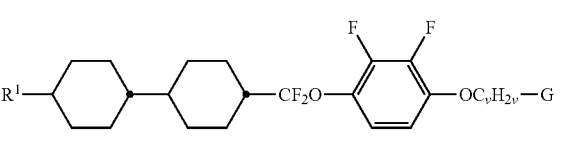
IAc-27
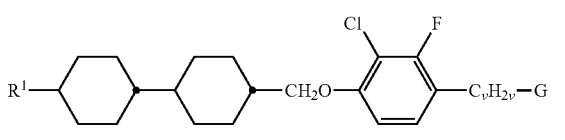
IAc-28
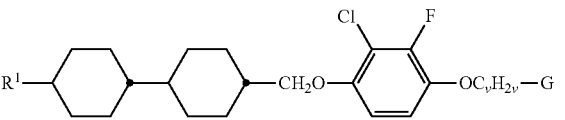
IAc-29
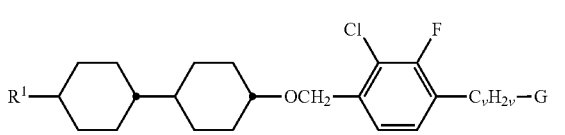
IAc-30
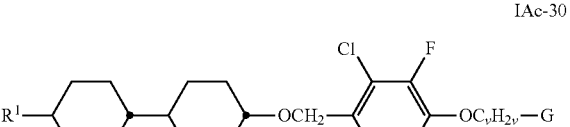
IAc-31
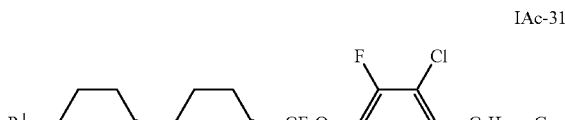
IAc-32

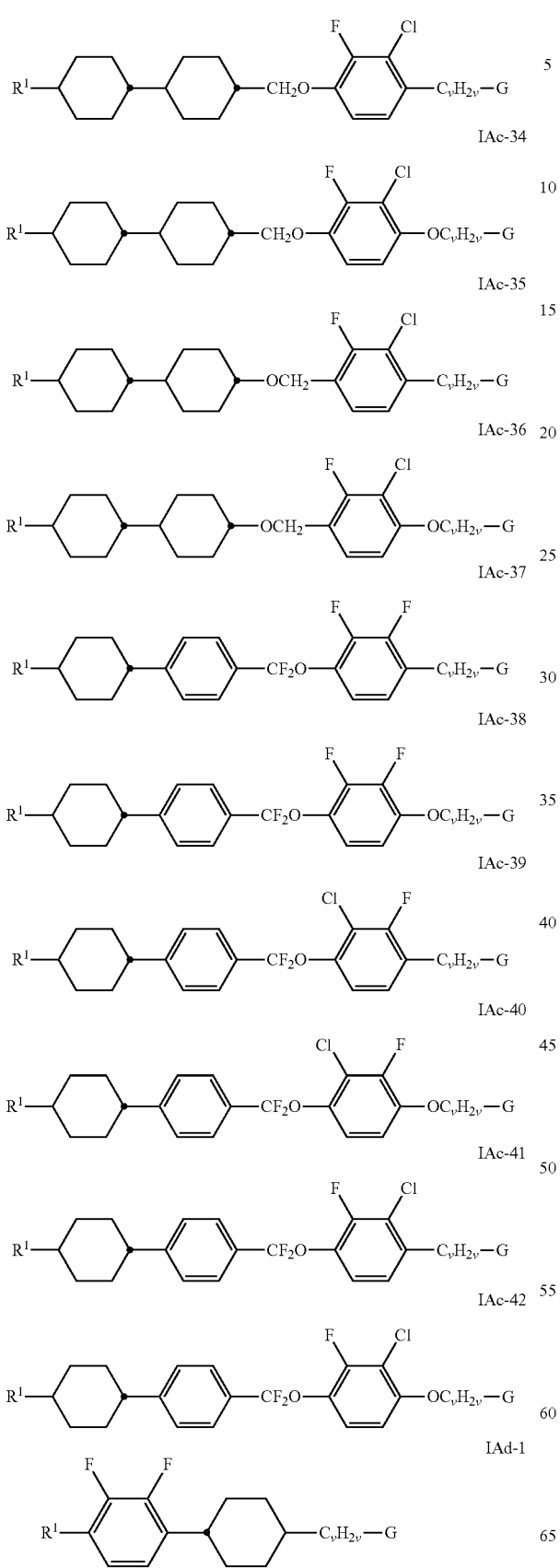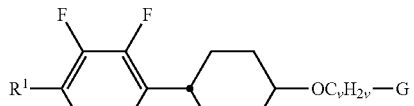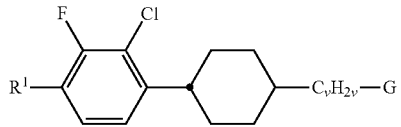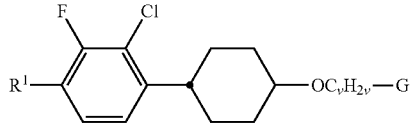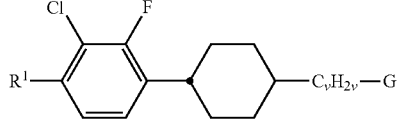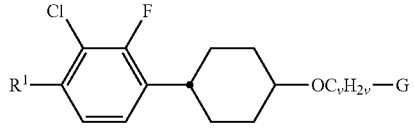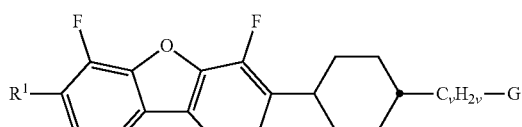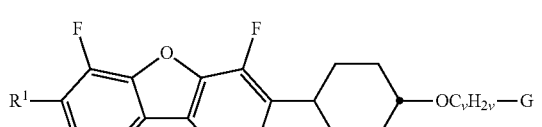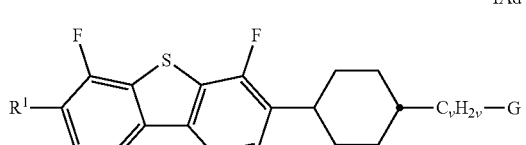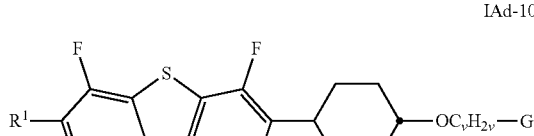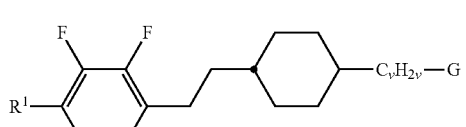

-continued
IAd-12
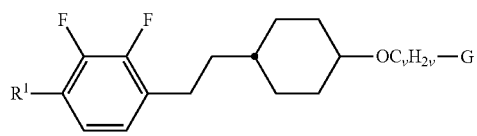
IAd-13
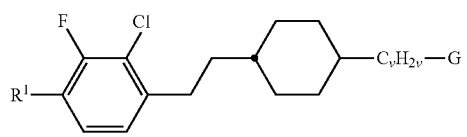
IAd-14
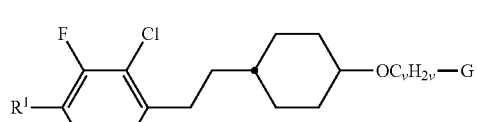
IAd-15
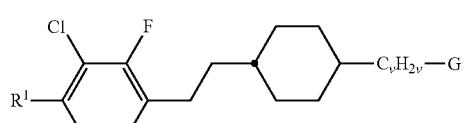
IAd-16
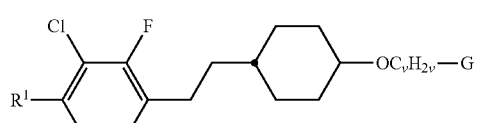
IAd-17
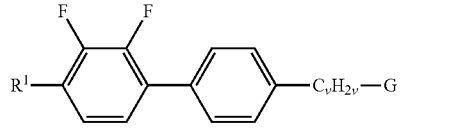
IAd-18
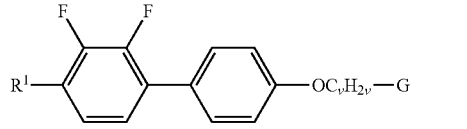
IAd-19
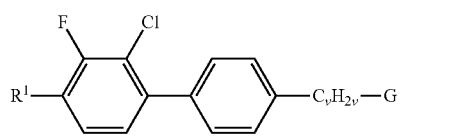
IAd-20
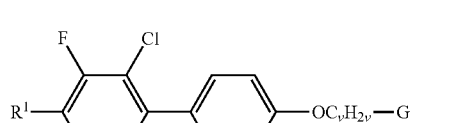
IAd-21
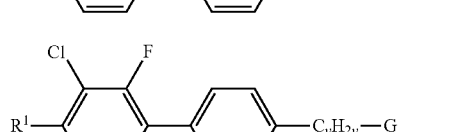
IAd-22
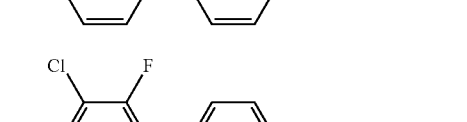
-continued
IAd-23
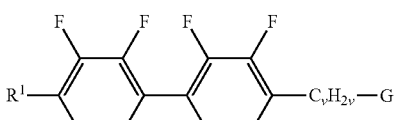
IAd-24
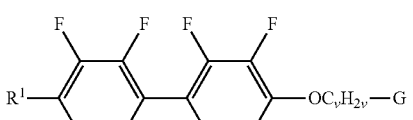
IAd-25
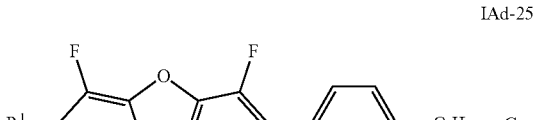
IAd-26
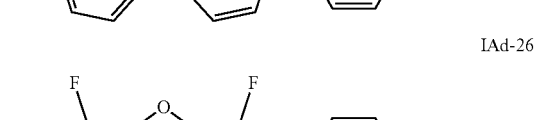
IAd-27
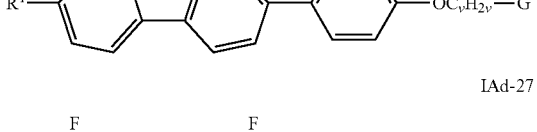
IAd-28
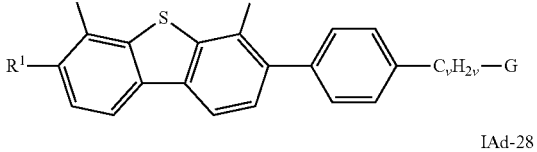
IAd-29
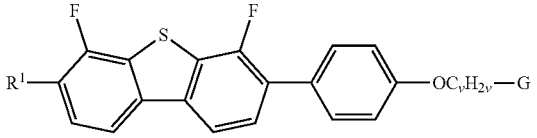
IAd-30
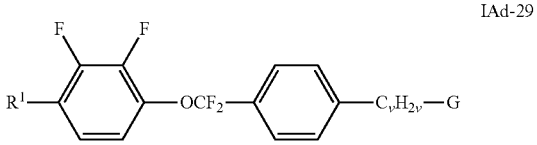
IAd-31
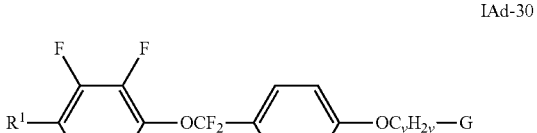
IAd-32
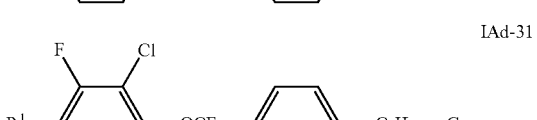

IAd-33
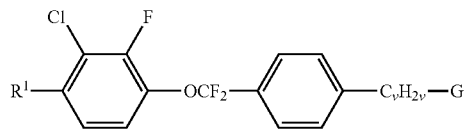
IAd-34
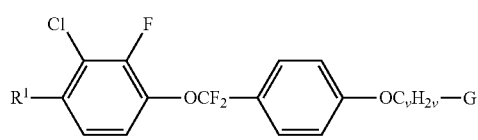
IAe-1
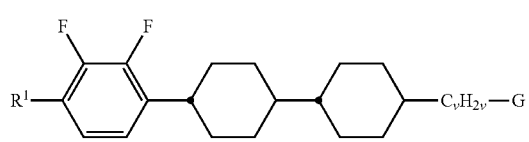
IAe-2
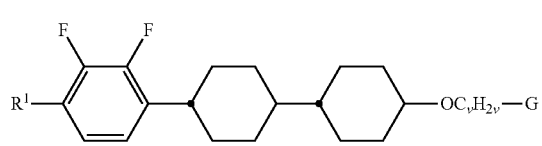
IAe-3
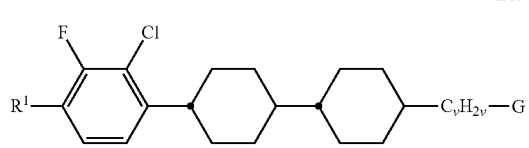
IAe-4
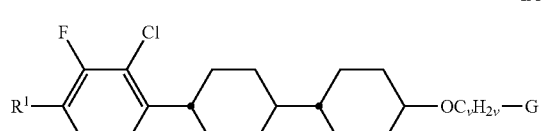
IAe-5
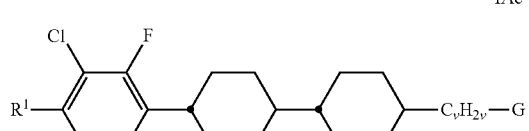
IAe-6
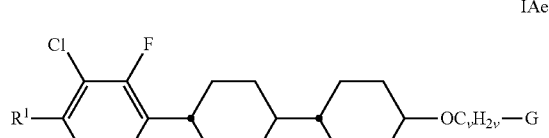
IAe-7
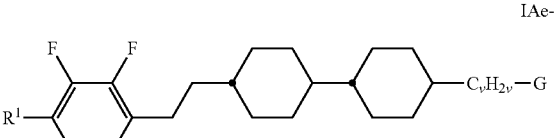
IAe-8
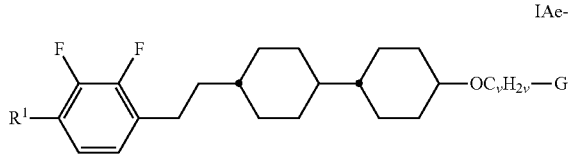
IAe-9
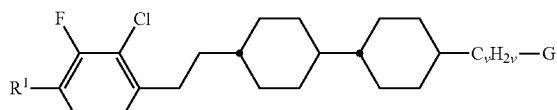
IAe-10
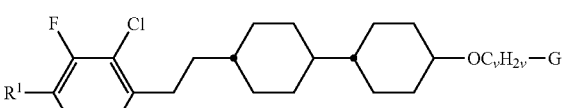
IAe-11
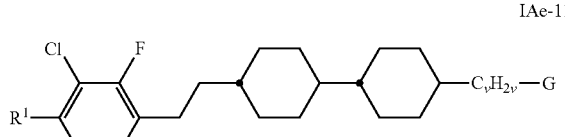
IAe-12
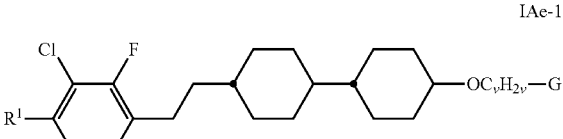
IAe-13
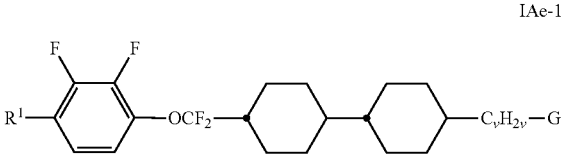
IAe-14
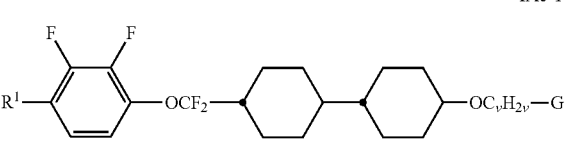
IA#-15
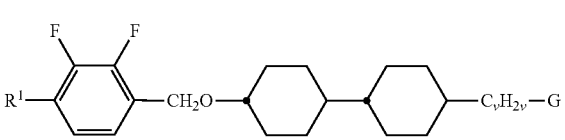
IAe-16
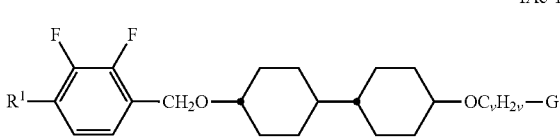
IAe-17
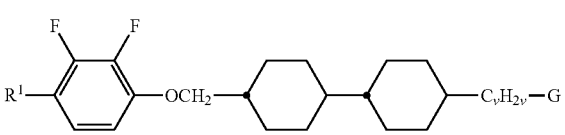
IAe-18
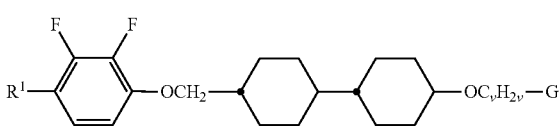

-continued
IAe-39
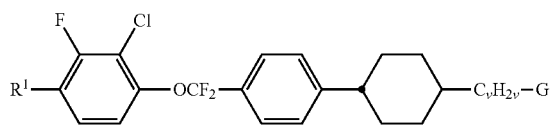
IAe-40
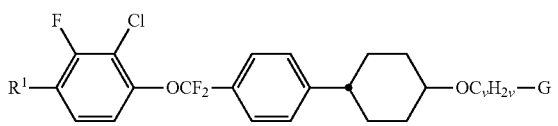
IAe-41
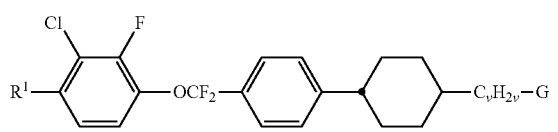
IAe-42
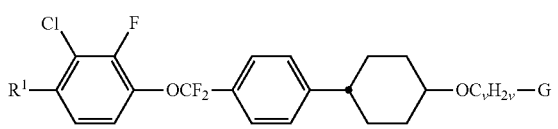
IAf-1
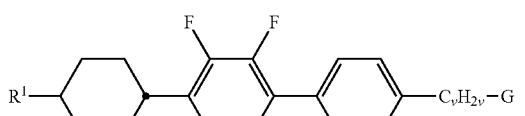
IAf-2
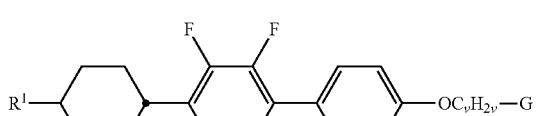
IAf-3
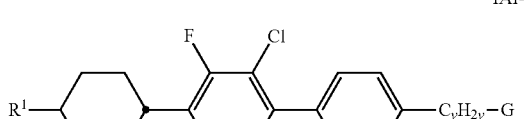
IAf-4
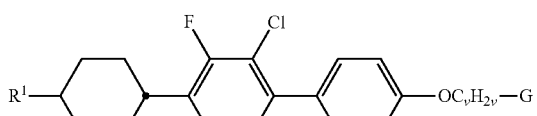
IAf-5
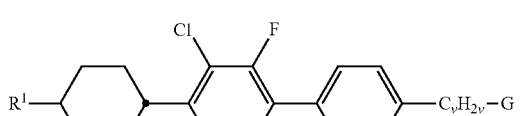
IAf-6
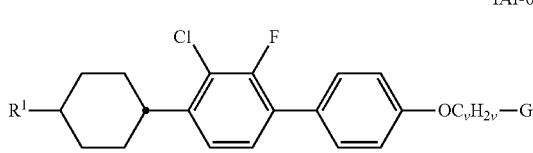
-continued
IAf-7
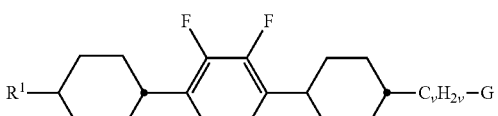
IAf-8
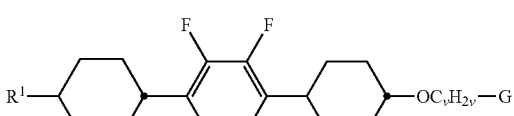
IAf-9
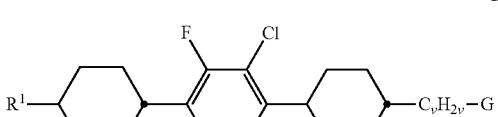
IAf-10
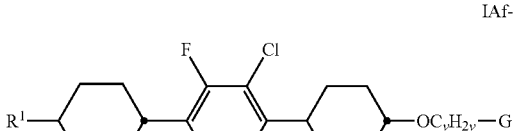
IAf-11
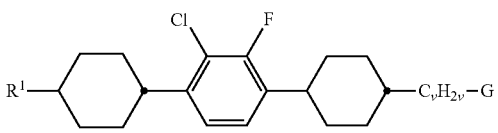
IAf-12
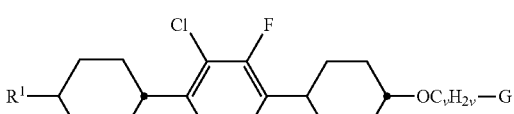
IAf-13
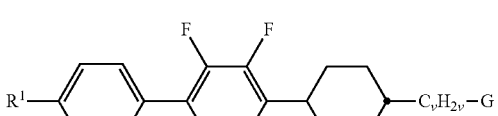
IAf-14
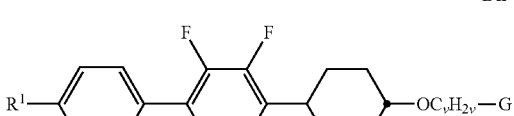
IAf-15
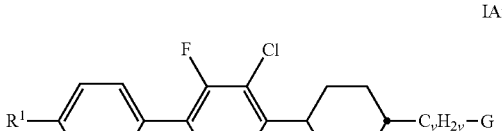
IAf-16
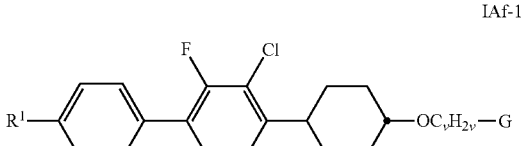

-continued

IAf-17

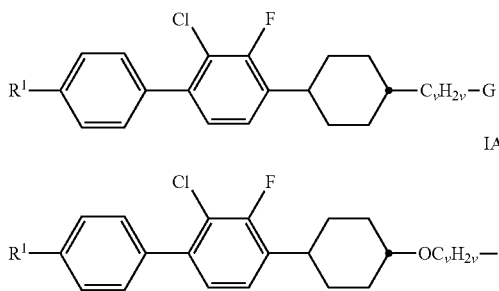

IAf-18 in which R¹ has the meaning of R¹ᴬ defined above and G has the meanings given above and preferably
R¹ᴬ denotes alkyl having 1 to 7 C atoms,
G denotes —OH or —OSiMe₃,
and
v denotes an integer from 1 to 12, preferably from 2 to 7.

Particularly preferred sub-formulae of the formula IB are the sub-formulae IBa to IBf:

D¹-Z^D—B¹-Sp-G     IBa

D¹-Z^D-(A¹-Z¹)—B¹-Sp-G     IBb

D¹-Z^D-(A¹-Z¹)₂—B¹-Sp-G     IBc

D¹-Z^D—B¹—(Z²-A²)-Sp-G     IBd

D¹-Z^D—B¹—(Z²-A²)₂-Sp-G     IBe

D¹-Z^D-(A¹-Z¹)—B¹—(Z²-A²)-Sp-G     IBf in which D¹, A¹, A², B¹, Z^D, Z¹, Z², Sp and G have the meanings indicated above.

In formula IB and its sub-formulae, very preferably A¹ and A² identically or differently, denote

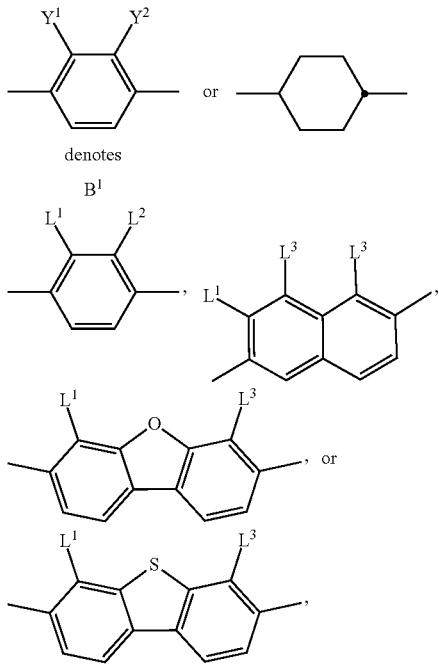

denotes B¹

D¹ denotes adamantyl or diamantyl, in particular adamantyl,

L¹ and L², independently of one another, denote CF₃, Cl or F, where at least one of the radicals L¹ and L² denotes F, L³ denotes F, Y¹ and Y², independently of one another, denote H, Cl or F, Z^D denotes a single bond, —C≡C—, —C(O)O—, —OC(O)—, —OCH₂—, —CH₂O—, —CH₂CH₂—, —CH₂CH₂CH₂—, or —CH₂CH₂CH₂CH₂—, Z¹, Z², independently of one another, denote a single bond, —C(O)O—, —OC(O)—, —CF₂O—, —OCF₂—, —CH₂O—, —OCH₂—, —CH₂CH₂—, particularly preferably a single bond, Sp denotes unbranched 1,ω-alkylene having 1, 2, 3, 4, 5, 6, 7, 8, 9, 10, 11 or 12 C atoms, G denotes —OH or OSiMe₃, In a further preferred embodiment, in the compounds of the formulae IBa to IBf, Sp denotes unbranched 1,ω-perfluoroalkylene having 1 to 12 C atoms, where D¹, A¹, A², B¹, Z¹, Z², and G have the meanings indicated above.

Very particularly preferred sub-formulae of the formula IB are the sub-formulae IBa, IBb and IBd, in particular the following compounds:

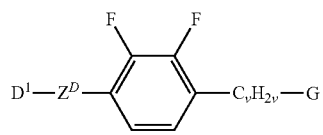
IBa-1

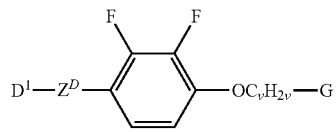
IBa-2

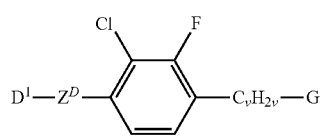
IBa-3

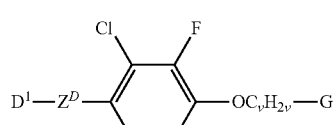
IBa-4

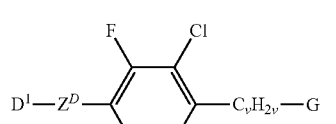
IBa-5

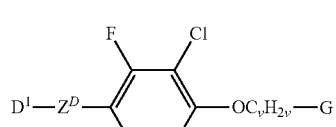
IBa-6

IBa-7
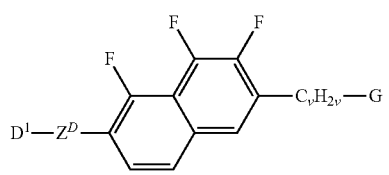
IBa-8
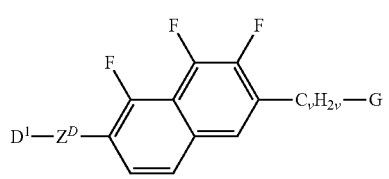
IBa-9
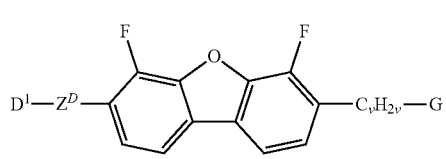
IBa-10
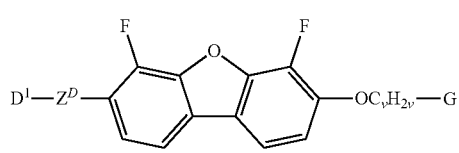
IBa-11
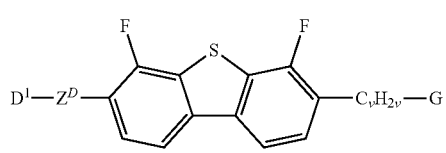
IBa-12
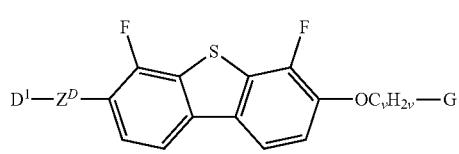
IBb-1
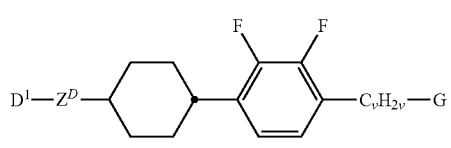
IBb-2
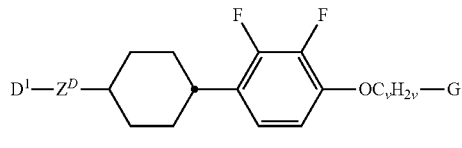
IBb-3
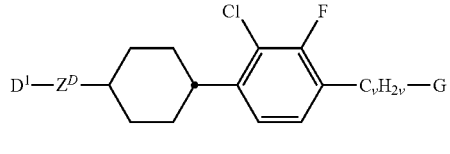
IBb-4
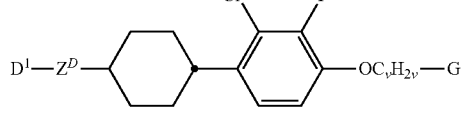
IBb-5
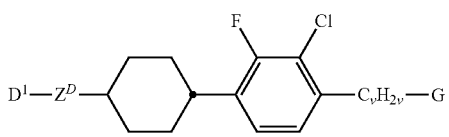
IBb-6
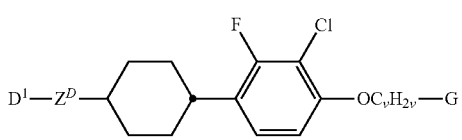
IBb-7
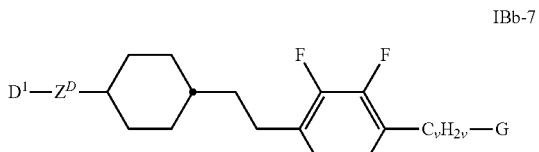
IBb-8
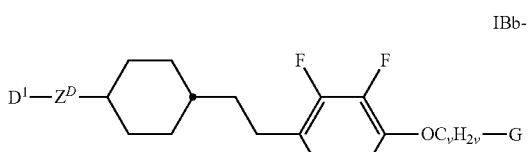
IBb-9
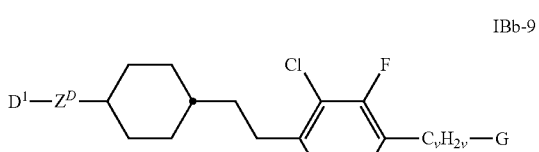
IBb-10
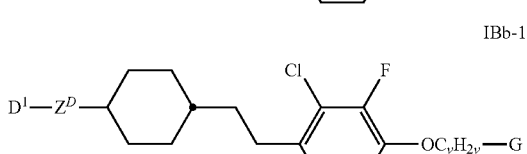
IBb-11
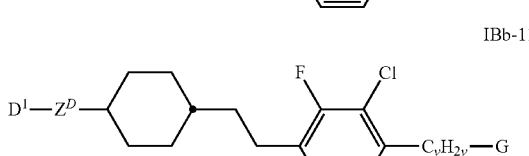
IBb-12
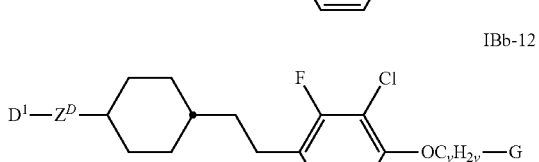
IBb-13
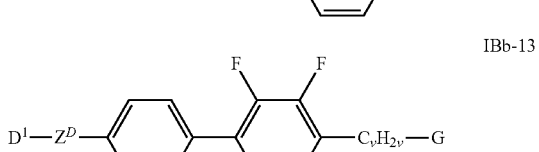
IBb-14
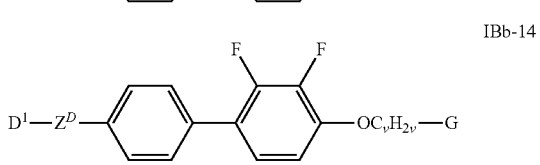

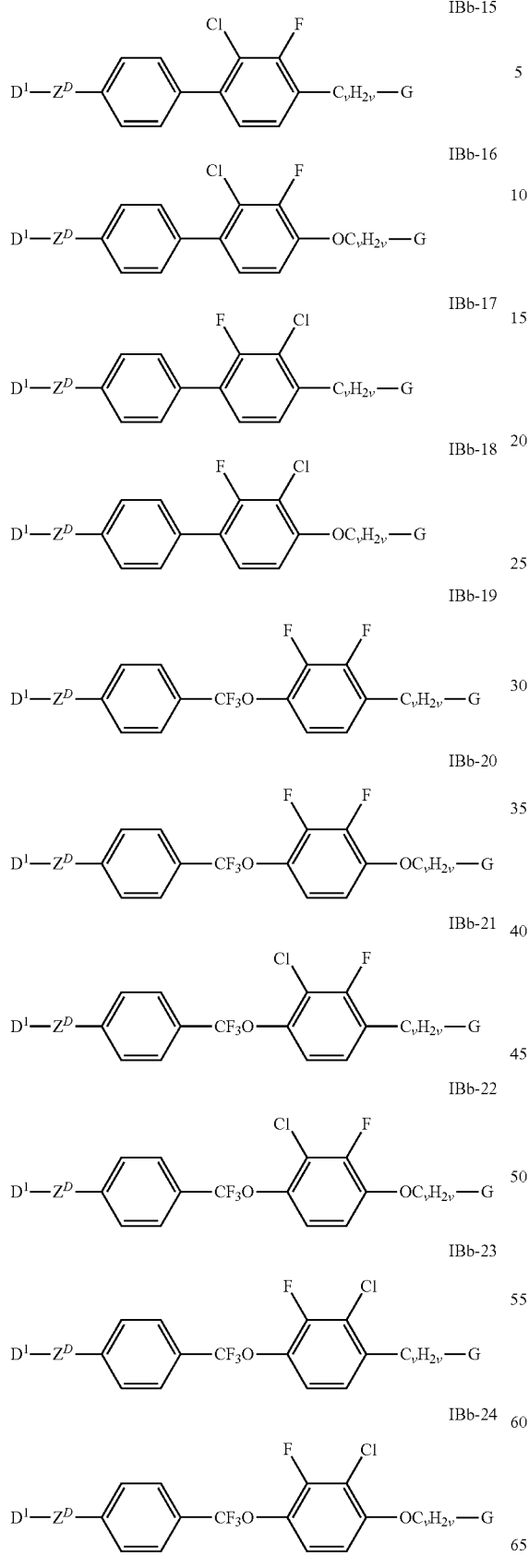
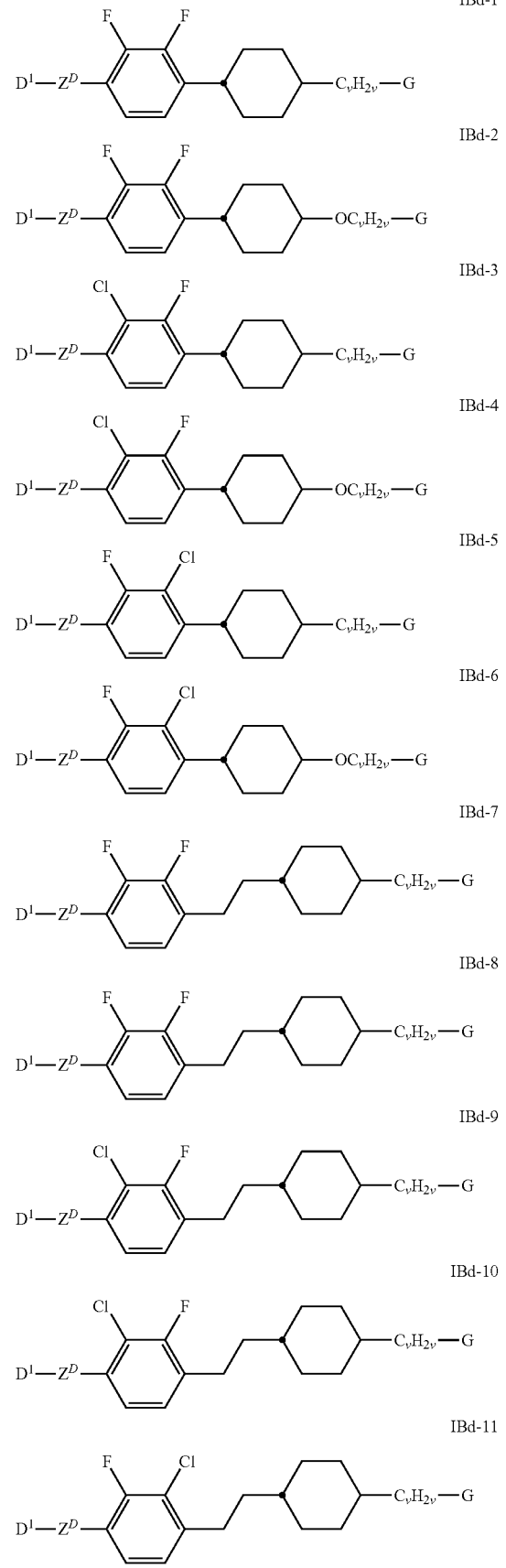

-continued

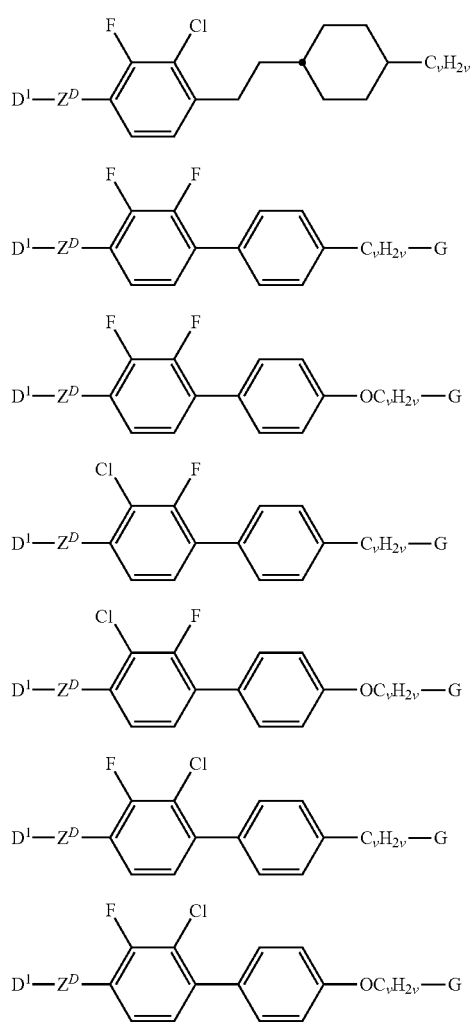

in which $D^1$, $Z^D$, and G have the meanings given above and preferably
- $D^1$ denotes adamantyl or diamantyl,
- $Z^D$ denotes —CH$_2$O—, —C≡C— or a single bond,
- G —OH or —OSiMe$_3$, and in which
- v is an integer from 1 to 12, preferably from 2 to 7.

In formula IC and its sub-formulae, very preferably $A^1$ and $A^3$ identically or differently, denote

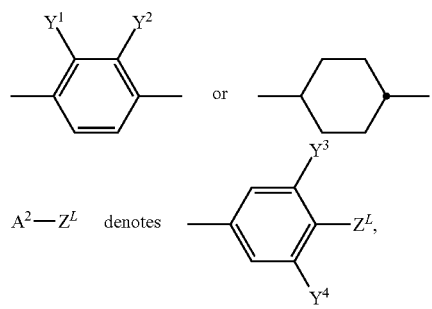

-continued

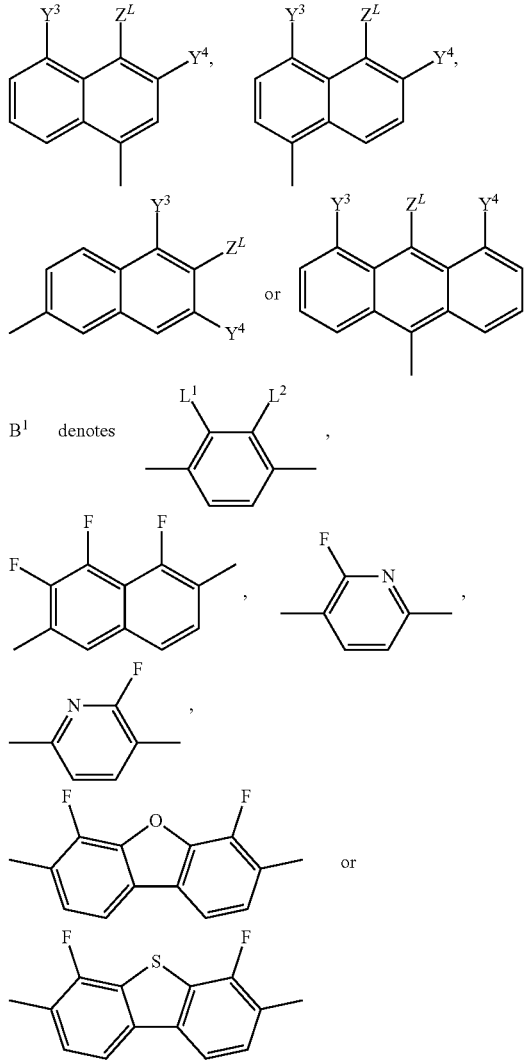

- $R^{1C}$ denotes H, straight chain or branched alkyl, alkenyl, alkynyl, alkoxy each having up to 12 C atoms, adamantyl or adamantylmethyloxy,
- $L^1$ and $L^2$ identically or differently, denote F, CF$_3$ or Cl,
- $Y^1$ and $Y^2$ identically or differently, have one of the meanings given above for Y and preferably denote H, F or Cl,
- $Y^3$ and $Y^4$, identically or differently, have one of the meanings given above for $Y^3$ and $Y^4$ and preferably denote methyl, ethyl, isopropyl, cyclopropyl, cyclobutyl, cyclopentyl, cyclopentenyl, cyclohexyl, cyclohexenyl, methoxy, trifluoromethyl, trifluoromethoxy, or trifluoromethylthio
- $Z^L$ denotes —O—,
- $Z^1$, $Z^2$, independently of one another, denote a single bond, —C(O)O—, —OC(O)—, —CF$_2$O—, —OCF$_2$—, —CH$_2$O—, OCH$_2$— or —CH$_2$CH$_2$—, in particular a single bond, and
- G denotes —OH, —OSiMe$_3$ or —OSiEt$_3$.

Very preferred sub-formulae of the formula IC are the sub-formulae IC-1 to IC-6:

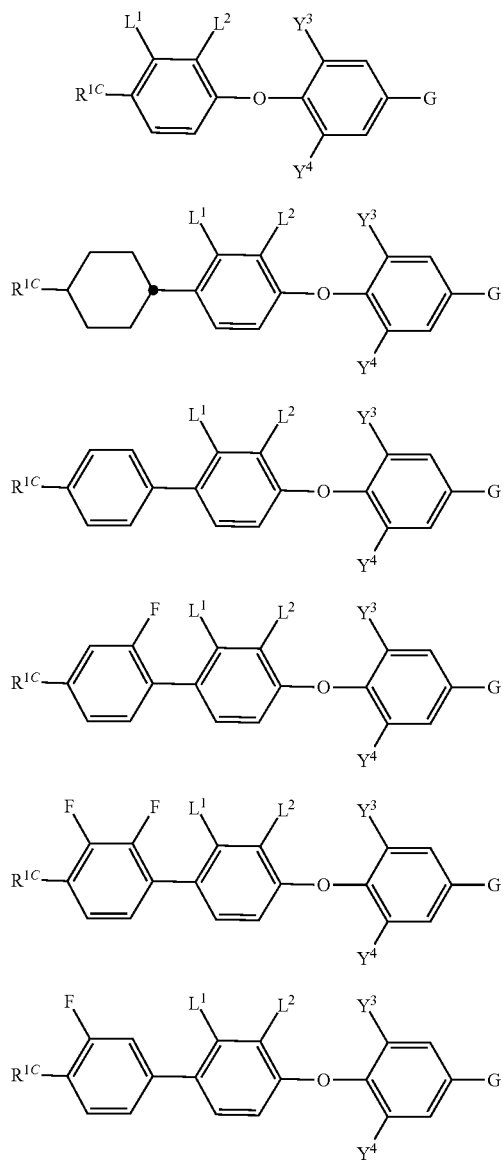

IC-1
IC-2
IC-3
IC-4
IC-5
IC-6 in which
R$^{1C}$ has one of the meanings given above,
L$^1$ and L$^2$ identically or differently, denote F, F$_3$, or Cl,
Y$^3$ and Y$^4$, identically or differently, have one of the meanings given above and preferably denote methyl, and
G —OH or —OSiMe$_3$.

According to another aspect of the invention the molecular layer comprises one or more chiral non-racemic compounds selected from the compounds of the formulae IA, IB and IC.

The molecular layers obtained from chiral compounds of the formulae IA, IB and IC enable memristic devices with significantly reduced stochastic noise and faster switching, reducing the read and write error rate, which has a positive effect on energy-efficiency. In addition, increased tunnel current are observed allowing for the integration to smaller junction sizes.

Preferably, the chiral compound has an enantiomeric excess (ee) of above 50%, preferably above 80%, 90%, or 95%, more preferably above 97%, in particular above 98%.

Chirality is achieved by a branched chiral group Sp of formula IA or IB above having one or more, preferably one or two, very preferably one, asymmetrically substituted carbon atom (or: asymmetric carbon atom, C*), hereinafter referred to as Sp*. In Sp* the asymmetric carbon atom is preferably linked to two differently substituted carbon atoms, a hydrogen atom and a substituent selected from the group halogen (preferably F, Cl, or Br), alkyl or alkoxy with 1 to 5 carbon atoms in each case, and CN.

The chiral organic radical Sp* preferably has the formula

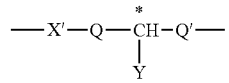

in which
X' has the meanings defined above for formula IA and IB and preferably denotes —CO—O—, —O—CO—, —O—CO—O—, —CO—, —O—, —S—, —CH=CH—, —CH=CH—COO— or a single bond, more preferably —CO—O—, —O—CO—, —O— or a single bond, very preferably —O— or a single bond,
Q and Q' identically or differently, denote a single bond or optionally fluorinated alkylene having 1 to 10 carbon atoms, in which a CH$_2$ group not linked with X can also be replaced by —O—, —CO—,
—O—CO—, —CO—O— or —CH=CH—, preferably alkylene having 1 to 5 carbon atoms or a single bond, particularly preferably —(CH$_2$)$_{n5}$—,
or a single bond,
n5 is 1, 2, 3, 4, 5, or 6,
Y denotes optionally fluorinated alkyl having 1 to 15 carbon atoms, in which one or two non-adjacent CH$_2$ groups can also be replaced by —O—, —CO—, —O—CO—, —CO—O— and/or —CH=CH—, further CN or halogen, preferably optionally fluorinated alkyl or alkoxy having 1 to 7 C atoms, —CN or Cl, particularly preferably —CH$_3$, —C$_2$H$_5$, —CF$_3$ or Cl, In an embodiment in which Z$^D$ in formula IB is a chiral non-racemic spacer group, the group D$^1$-Sp* preferably has the formula

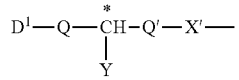

in which the occurring groups have the meanings given above.

In addition, chirality is achieved by a chiral group R$^{1A}$ of formula IA above or by a chiral group R$^{1C}$ of formula IC above having one or more, preferably one or two, very preferably one, asymmetrically substituted carbon atom (or: asymmetric carbon atom, C*), hereinafter referred to as R*.

In R* the asymmetric carbon atom is preferably linked to two differently substituted carbon atoms, a hydrogen atom and a substituent selected from the group halogen (preferably F, C, or Br), alkyl or alkoxy with 1 to 5 carbon atoms in each case, and CN.

The chiral organic radical preferably has the formula

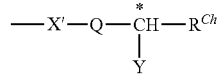

in which
X' has the meanings defined above for formula I and preferably denotes —CO—O—, —O—CO—, —O—CO—O—, —CO—, —O—, —S—, —CH=CH—, —CH=CH—COO— or a single bond, more preferably —CO—O—, —O—CO—, —O—, or a single bond, very preferably —O— or a single bond, Q denotes a single bond or optionally fluorinated alkylene having 1 to 10 carbon atoms, in which a $CH_2$ group not linked with X can also be replaced by —O—, —CO—, —O—CO—, —CO—O— or —CH=CH—, preferably alkylene having 1 to 5 carbon atoms or a single bond, particularly preferably —$CH_2$—, —$CH_2CH_2$— or a single bond, Y denotes optionally fluorinated alkyl having 1 to 15 carbon atoms, in which one or two non-adjacent $CH_2$ groups can also be replaced by —O—, —CO—, —O—CO—, —CO—O— and/or —CH=CH—, further CN or halogen, preferably optionally fluorinated alkyl or alkoxy having 1 to 7 C atoms, —CN or Cl, particularly preferably —$CH_3$, —$C_2H_5$, —$CF_3$ or C, $R^{Ch}$ denotes an alkyl group having 1 to 15 carbon atoms that is different from Y, in which one or two non-adjacent $CH_2$ groups can also be replaced by —O—, —CO—, —O—CO—, —CO—O— and/or —CH=CH—, preferably denotes straight-chain alkyl having 1 to 10, in particular 1 to 7, carbon atoms, in which the $CH_2$ group linked to the asymmetric carbon atom can be replaced by —O—, —O—CO— or —CO—O—.

In an embodiment in which $R^{1C}$ of formula IC denotes a group $D^1$-$Z^D$ as defined above, the group R* has the formula $D^1$-Sp* in which Sp* denotes a chiral non-racemic spacer group.

As described for formula IB, the group $D^1$-Sp* in formula IC preferably has the formula

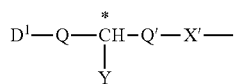

in which Dia, Q, Y and X' have the meanings defined above, and
Q' identically or differently, has the meanings given above for Q.

The synthesis of the compounds of the formulae IA, IB and IC are described in the literature, for example in P. Kirsch, M. Bremer, Angew. Chem. Int. Ed. 2000, 39, 4216-4235; M. Bremer, P. Kirsch, M. Klasen-Memmer, K. Tarumi, Angew. Chem. Int. Ed. 2013, 52, 8880-8896; P. Kirsch, V. Reiffenrath, M. Bremer, Synlett 1999, 389-396; WO 2016/110301 A1, and WO 2018/007337 A2, or can be prepared by known methods, as described in the literature (for example in the standard works, such as Houben-Weyl, Methoden der organischen Chemie [Methods of Organic Chemistry], Georg-Thieme-Verlag, Stuttgart), to be precise under reaction conditions which are known and are suitable for said reactions.

The silylated compounds of the formulae IA, IB and IC are derived from the corresponding alcohols by silylation with reagents as typically used for the protection of alcohols (cf. Wuts, Peter G. M. Greene's protective groups in organic synthesis. -4th ed./Peter G. M. Wuts, Theodora W. Greene, John Wiley & Sons, Inc., Hoboken, New Jersey, 2007).

According to another aspect of the present invention there is provided a compound of the formula IA-1, IB-1 and IC-1

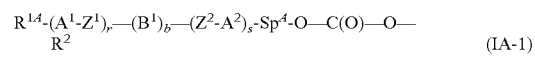  (IA-1)

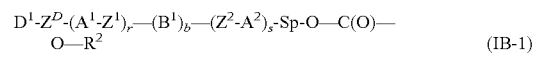  (IB-1)

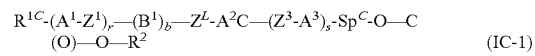  (IC-1)

in which the occurring groups and parameters have the meanings defined above for the formulae IA, IB and IC, b is 0 or 1, preferably 1, and $R^2$ denotes primary or secondary or tertiary alkyl having 1 to 6 C atoms, preferably tert.-butyl, or a group $SiR_3$ in which R denotes alkyl having 1 to 6 C atoms, preferably n-alkyl, very preferably methyl, ethyl or isopropyl.

The alkyl carbonates IA-1, IB-1 and IC-1 can be prepared by methods known to the skilled person, preferably from the corresponding hydroxyl compound, for example by treatment with dialkyldicarbonate as described in the article T. Hara, S. R. Durell, M. C. Myers, D. H. Appella, *J. Am. Chem. Soc.* 2006, 128, 1995-2004, or according to the article Z. Guan, X. Chai, S. Yu, Q. Meng, Q. Wu, *Chem. Biol. Drug Des.* 2010, 76, 496-504, by reaction with the chloroformic alkylester, such as tert-butyl chloroformate.

Trialkylsilyl carbonates, where in the formulae IA-1, IB-1 and IC-1 $R^2$ denotes $SiR_3$, are preferably prepared by treatment of the corresponding tert-butyl carbonate with trialkylsilyl iodide, as published in I. Galyker, W. C. Still, *Tetrahedron Lett.* 1982, 23, 4461-4464.

Examples of the compounds of the formulae IA-1, IB-1 and IC-1 are the following:

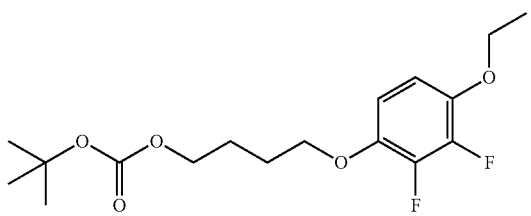

-continued
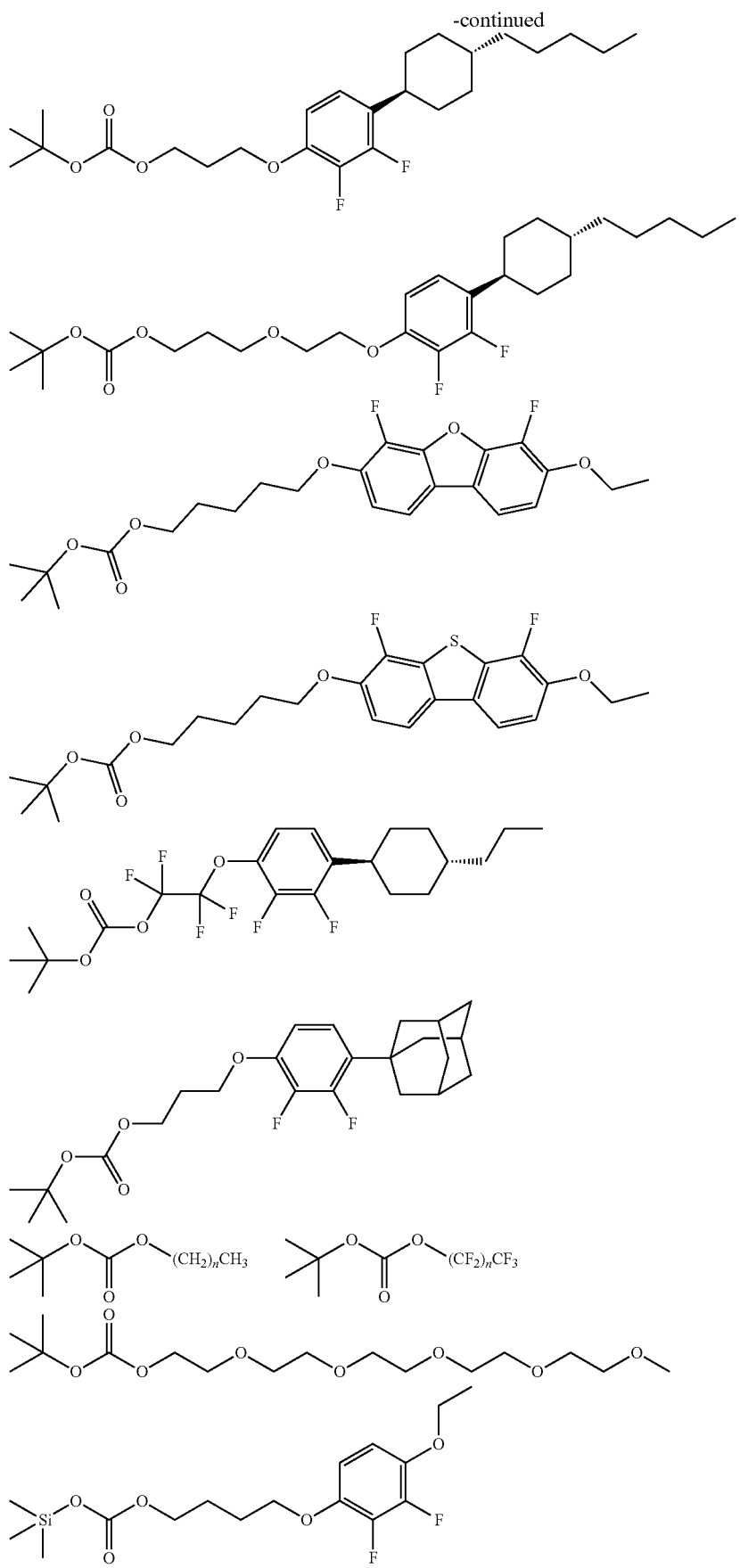

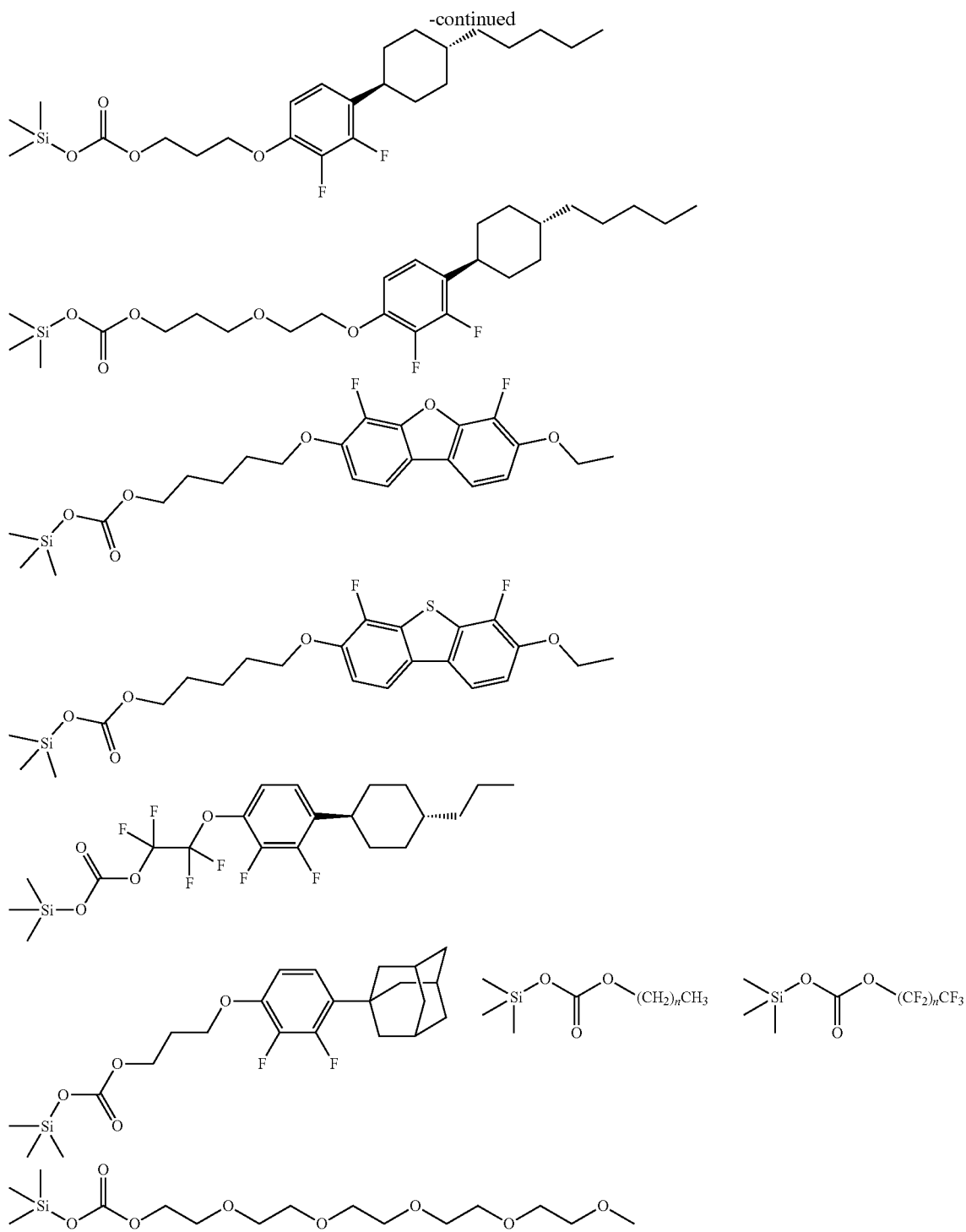

The compounds of the formulae IA-1, IB-1 and IC-1 may also be processed from solution according to processes described in WO 2019/238649 A1.

In such a process using alkyl or trialkylsilyl carbonates for the deposition of SAMs from the liquid phase preferably carbonates with a decomposition temperature below 200° C. are used. The carbonates are deposited by spin-coating, spray-coating, slit-casting, ink-jet or other printing techniques onto a suitable substrate. The deposition parameters (concentration, viscosity, rotational speed profile for spin coating) are adjusted in a way that an excess of SAM precursor is deposited per area. Typical substrates are oxides ($SiO_2$, $A^1_2O_3$, $TiO_2$, ITO, IZO, AZO, IGZO, $HfO_2$, $ZrO_2$, etc.), nitrides ($Si_3N_4$, $TaN_x$, $TiN_x$, etc.), mixed oxynitrides ($TiN_xO_y$, $TaN_xO_y$) or metals (W, Mo, Co, Cr, Al, Cu, Ag, etc.). A thin adhesion layer of a suitable oxide can be generated by the usual methods such as ALD, CVD, wet chemical or oxygen plasma treatment. The initial SAM precursor layer is dried and then subjected to an elevated temperature (typically 70-250° C.). Without wishing to be bound by theory it is assumed that this annealing step results in the thermal cleavage of the compound into a carbocation/trialkylsilyl group, carbon dioxide and the liberation of a free hydroxyl SAM precursor. In a first step, the carbocation/trialkylsilyl group undergoes an addition reaction with the non-metallic or superficially oxidized metallic surface activating the substrates surface. The second step involves a substitution of the surface bound tert-butyl/trialkylsilyl group by the hydroxyl group of the SAM molecule, releasing either alcohol/trialkylsilanol groups or the corresponding ether/siloxane. The remaining alkyl/trialkyl silyl groups are incorporated into the monolayer, passivating non-reactive or sterically hindered surface spots. The excess of hydroxyl SAM precursor and byproducts is subsequently washed off with a suitable solvent (PGMEA, ethanol, THF and the like) supported by heating, agitation or sonication. Optionally, the resulting SAM can be subjected to an additional thermal annealing step or repeated deposition-annealing-rinsing cycles to improve SAM density.

Preferred are structures with mesogenic groups exemplified above. Particularly preferred are such compounds, which have a dipole moment perpendicular to the long molecular axis.

The method according to the invention has the advantage of improved surface passivation: non-reacted surface hydroxyl groups can act as electronic trap states, reducing the overall performance of the SAM based device. An in-situ-passivation of those potential defects by small molecules can increase the device performance and reliability.

Furthermore, the method provides intermediates that have an increased reactivity towards surface oxides: surfaces like $SiO_2$ are hardly functionalized by hydroxyl compounds directly, due to the low reactivity of the hydroxyl group towards those surfaces and the unfavored thermodynamic equilibrium of the overall reaction. The in-situ activation of the surface oxide via transformation into alcohol or alkylsilanol groups allows the free optimization of the relevant parameters for surface functionalization (device/process functionality, reactivity, surface bound density temperature profile) and other deposition or printing techniques.

Materials in particular for use in nanoelectronics require extremely high purity standards, e.g., with metal ion concentrations in the ppb and even ppt range. Due to their polarity, alcohols have a higher affinity to metal ions and are therefore extremely difficult to purify effectively. The carbonates are relatively non-polar and can be processed in a much larger variety of solvents. This facilitates their purification considerably.

The substrate and the first and second electrodes may comprise a metal and/or any other conductive material.

The anchoring layer consists of a material obtainable by ALD.

Preferably, the substrate and the electrodes comprise a material selected from the group consisting of Si, Ge, diamond, graphite, graphene, fullerene, α-Sn, B, Se, Te; GaAs, GaP, InP, InSb, InAs, GaSb, CrN, HfN, GaN, TaN, TiN, MoN, NbN, WCN, WN, AlN, InN, VN, ZrN, AlxGa1-xAs and InxGa1-xNi, ZnO, ZnS, ZnSe, ZnTe, CdS, CdSe, CdTe, Hg(1-$_x$)Cd($_x$)Te, BeSe, BeTe$_x$ and HgS; GaS, GaSe, GaTe, InS, InSe$_x$ and InTe, CuInSe$_2$, CuInGaSe$_2$, CuInS$_2$ and CuInGaS$_2$, SiC and SiGe, SeTe;

polythiophene, tetracene, pentacene, phthalocyanines, PTCDA, MePTCDI, quinacridone, acridone, indanthrone, flavanthrone, perinone, AlQ$_3$, PEDOT:PSS and polyvinylcarbazole/TLNQ complexes;

Ta, Ti, Co, Cr, Mo, Nb, Ni, Pt, Ru, Au, Ag, Cu, Al, W and Mg;

indium tin oxide, indium gallium oxide, InGa-α-ZnO, aluminium-doped zinc oxide, tin-doped zinc oxide, fluorine-doped tin oxide and antimony tin oxide.

In a preferred embodiment, the first and second electrodes, identically or differently, comprise a material selected from the group consisting of Ag, Al, Au, Co, Cr, Cu, Mo, Nb, Ni, Pt, Ru, Si, W, CrN, HfN, MoN, NbN, TiN, TaN, WN, WCN, VN and ZrN.

More preferably, the first and second electrodes, identically or differently, comprise, preferably consist of a metal nitride selected from CrN, HfN, MoN, NbN, TiN, TaN, WN, tungsten carbide nitride (WCN), VN and ZrN.

In particular, the first electrode consist of a metal nitride selected from CrN, HfN, MoN, NbN, TiN, TaN, WN, WCN, VN and ZrN, and the second electrode consists of TiN.

Very particularly preferably, the first and the second electrode both consist of TiN.

Preferably, the anchoring layer comprises a material selected from the group consisting of Ag, Al, Au, Co, Cr, Cu, Mo, Nb, Ni, Pt, Ru, Si, W, CrN, HfN, MoN, NbN, TiN, TaN, WN, WCN, VN and ZrN, $Al_2O_3$, $HfO_2$, $RuO_2$, $SiO_2$, $TiO_2$, and $ZrO_2$.

In some embodiments, the method may also involve forming a third layer using atomic layer deposition in the same or another deposition chamber. The third layer may be operable as a second electrode and be formed over the molecular layer, e.g., directly interfacing the second layer. The method may continue with forming a fourth layer over the third layer without breaking vacuum in the deposition chamber between forming the third and fourth layers. The fourth layer may be operable as a protective layer and preventing oxidation of the third layer. The fourth layer may be formed using any deposition technique, such as atomic layer deposition, physical vapor deposition, and chemical vapor deposition.

In some embodiments, the deposition chamber used for deposition of the third layer is different from the processing chamber used for deposition of the first layer and the molecular layer. In this situation, the molecular layer may be exposed to the ambient environment prior to forming the third layer and the molecular layer protects the bottom layer from oxygen in the ambient environment. Consequently, the third layer may be deposited by ALD or by any other deposition method such as physical vapor deposition or chemical vapor deposition A brief description of nonvolatile resistive memory elements is provided for context and better understanding of various features associated with sequential deposition of electrodes and molecular switching layers. A memory element includes a dielectric material exhibiting resistive switching characteristics. A dielectric, which is normally insulating, can be realized as described herein by a molecular layer comprising compounds (I) above, across which a tunnel current may flow after application of a sufficiently high voltage. As the molecules, which form the molecular layer have a molecular dipole moment, the resistivity of the molecular layer depends on the orientation of the dipole moments which may be re-oriented in an electric field from a first orientation to a second orientation to change the resistivity of the layer, thus, the switching layer may be set or re-set (resulting in a high or low resistance) by applying certain voltages.

A basic building unit of a memory element is a stack 100 having a capacitor like structure. A nonvolatile memory element includes two electrodes and a dielectric material positioned in between these two electrodes. FIG. 1A illustrates a schematic representation of nonvolatile memory element 100 including top electrode 105, also referred to as second electrode, bottom electrode 102, also referred to as first electrode, and resistance switching layer (molecular layer) 104 provided in between top electrode 105 and bottom electrode 102, where the molecular layer is bonded to an anchoring layer 103. It should be noted that the "top" and "bottom" references for electrodes 105 and 102 are used solely for differentiation and not to imply any particular spatial orientation of these electrodes. Often other references, such as "first formed" and "second formed" electrodes or simply "first" and "second", are used to identify the two electrodes. Nonvolatile memory element 100 may also include other components, such as an embedded resistor, diode, and other components. Nonvolatile memory element 100 is sometimes referred to as a memory element or a memory unit.

Figure 1B:
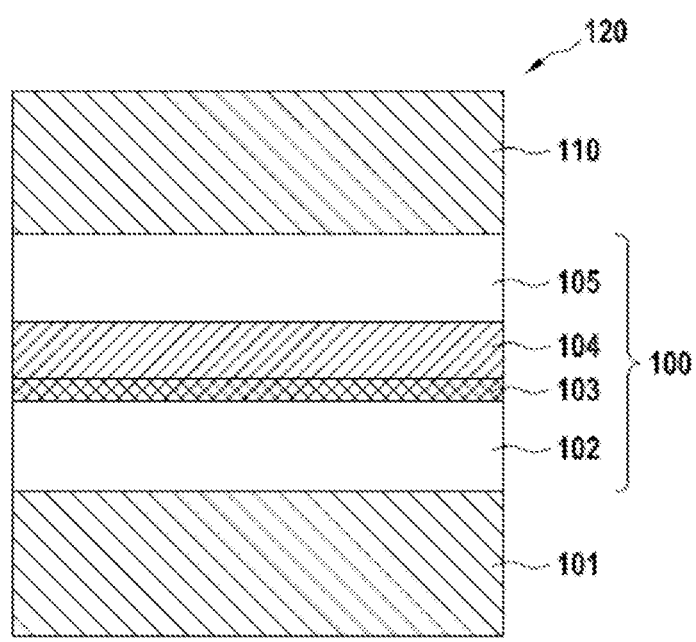
FIG. 1B shows a schematic illustration of a resistive switching memory element.

FIG. 1B illustrates a schematic representation of resistive switching memory element 120 fabricated in accordance with operations described above. Resistive switching memory element 120 includes base layer 101, which may function as a signal line, protective layer, or other type of layer. In some embodiments, the protective layer on the bottom serves the same purpose as a capping layer on the top. Base layer 101 provides a surface for deposition of bottom electrode 102. Bottom electrode 102 is disposed between substrate 101 and anchoring layer 103 to which molecular layer 104 is bonded. Top electrode 105 is provided above molecular layer 104 and may be covered by top layer 110. Top layer 110 may be a signal line, capping layer, or other type of layer.

Operation of nonvolatile memory element 100 will now be briefly described with reference to FIG. 2 illustrating a logarithmic plot of a current passing through a nonvolatile memory element as a function of a voltage applied to the electrode of nonvolatile memory element, in accordance with some embodiments. Nonvolatile memory element 100 may be either in a low resistive state (LRS) defined by line 202 or high resistive state (HRS) defined by line 201. Each of these states is used to represent a different logic state, e.g., HRS representing logic one and LRS representing logic zero or vice versa. Therefore, each nonvolatile memory element that has two resistance states may be used to store one bit of data. It should be noted that some nonvolatile memory elements may have three and even more resistance states allowing multi-bit storage in the same cell.

Without wishing to be bound by theory, HRS and LRS are defined by the orientation of the molecular dipoles of the molecules that form the molecular layer 104 which functions as a resistance switching layer. A nonvolatile memory element may be switched back and forth between LRS and HRS many times, defined by set and reset cycles. Furthermore, a nonvolatile memory element may maintain its LRS or HRS for a substantial period of time and withstand a number of read cycles.

The overall operation of nonvolatile memory element 100 may be divided into a read operation, set operation (i.e., turning the cell "ON"), and reset operation (i.e., turning the cell "OFF"). During the read operation, the state of nonvolatile memory element 100 or, more specifically, the resistance of the molecular layer 104 can be sensed by applying a sensing voltage to electrodes 102 and 105. The sensing voltage is sometimes referred to as a "read" voltage and indicated as $V_{read}$ in FIG. 2. If nonvolatile memory element 100 is in HRS represented by line 201, the external read and write circuitry connected to electrodes 102 and 105 will sense the resulting "off" current ($I_{off}$) that flows through nonvolatile memory element 100. As stated above, this read operation may be performed multiple times without switching nonvolatile memory element 100 between HRS and LRS. In the above example, the nonvolatile memory element 100 should continue to output the "off" current ($I_{off}$) when the read voltage ($V_{read}$) is applied to the electrodes.

Continuing with the above example, when it is desired to switch nonvolatile memory element 100 into a different logic state (corresponding to LRS), nonvolatile memory element 100 is switched from its HRS to LRS. This operation is referred to as a set operation. This may be accomplished by using the same read and write circuitry to apply a set voltage ($V_{set}$) to electrodes 102 and 105. Applying the set voltage ($V_{set}$) re-orients the molecular dipoles in the molecular layer 104 from a first orientation to a second orientation and switches nonvolatile memory element 100 from its HRS to LRS as indicated by dashed line 204.

In LRS, the resistance characteristics of nonvolatile memory element 100 are represented by line 202. In this LRS, when the read voltage ($V_{read}$) is applied to electrodes 102 and 105, the external read and write circuitry will sense the resulting "on" current ($I_{on}$) that flows through nonvolatile memory element 100. Again, this read operation may be performed multiple times without switching nonvolatile memory element 100 between LRS and HRS.

It may be desirable to switch nonvolatile memory element 100 into a different logic state again by switching nonvolatile memory element 100 from its LRS to HRS. This operation is referred to as a reset operation and should be distinguished from set operation during which nonvolatile memory element 100 is switched from its HRS to LRS. During the reset operation, a reset voltage ($V_{reset}$) of opposite polarity is applied to memory element 100 to re-orient the molecular layer 104 from said second orientation back to the first orientation to its first state and switches nonvolatile memory element 100 from its LRS to HRS as indicated by dashed line 206. Reading of nonvolatile memory element 100 in its HRS is described above. Overall, nonvolatile memory element 100 may be switched back and forth between its LRS and HRS many times. Read operations may be performed in each of these states (between the switching operations) one or more times or not performed at all.

In some embodiments, the set voltage ($V_{set}$) is between about 100 mV and 10V or, more specifically, between about 500 mV and 5V. The length of set voltage pulses ($t_{set}$) may be less than about 100 ms or, more specifically, less than about 5 ms and even less than about 100 ns. The read voltage ($V_{read}$) may be between about 0.1 and 0.5 of the write voltage ($V_{set}$). In some embodiments, the read currents ($I_{on}$ and $I_{off}$) are greater than about $10^{-10}$ A or, more specifically, are greater than about $10^{-8}$ A to allow for a fast detection of the state by reasonably small sense amplifiers. The length of read voltage pulse ($t_{read}$) may be comparable to the length of the corresponding set voltage pulse ($t_{set}$) or may be shorter than the write voltage pulse ($t_{reset}$).

A ratio of set and reset currents (i.e., a high $I_{set}/I_{reset}$ ratio) that correspond to set voltage (Vset) and reset voltage ($V_{reset}$) may be at least about 5 or, more specifically, at least about 10 to make the state of nonvolatile memory element easier to determine. Nonvolatile memory elements should be able to cycle between LRS and HRS between at least about $10^3$ times or, more specifically, at least about $10^7$ times without failure. A data retention time ($t_{ret}$) should be at least about 5 years or, more specifically, at least about 10 years at a thermal stress up to 85° C., and small electrical stress, such as a constant application of the read voltage ($V_{read}$). Other considerations may include low current leakage.

In some embodiments, bottom electrode 102 and/or top electrode 105, each has a thickness of less than 500 nm or, more specifically, less than 300 nm. These thickness ranges may be achieved in a controllable manner using ALD techniques described above. Furthermore, in some embodiments, the thickness of the stack including both electrodes 102 and 105 as well as molecular layer 104 is less than 300 nm or, more specifically, less than 100 nm.

EXAMPLES

Example 1

In an ALD tool (Veeco Savannah) the compound 1

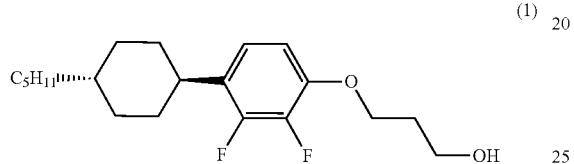

(1)

is deposited onto an $Al_2O_3$ anchoring layer on a substrate as follows:

A coupon (10×30 mm), diced out of a silicon wafer (6" inch, boron-doped, double side polished, 625 μm thickness, (100) orientation, 0.001-0.005 Ωcm resistivity, prime grade; native silicon oxide was removed directly prior to deposition by treatment with aqueous hydrofluoric acid (1 vol %, 1 min, RT)), is placed inside the processing chamber and 20 cycles of trimethylaluminium and water, respectively (pulse length 0.015 s each; substrate temperature 160° C., nitrogen carrier gas), are applied, followed by five pulses of trimethylaluminium, to create a reactive Al—$CH_3$ terminated surface. Then, compound (1) is evaporated (source temperature=170° C., vacuum≈0.1 torr) onto the reactive surface (substrate temperature=160° C., constant vapor stream at approx. 0.1 Torr), forming a molecular layer.

FIG. 3 illustrates a setup 300 for the determination of the electrical properties of the electronic component fabricated as described in the above examples. The silicon coupon is electrically conductive and serves here as a first electrode 102 in order to provide electrical contact for the molecular layer 104. The electrical connection to a measuring instrument is established here via a movable copper plate. To this end, the sample is placed on the copper plate 330 and can be moved relative to a second electrode 105 by moving the copper plate 330. The second electrode 105 used as electrical contact of the upper side of the molecular layer is a mercury drop electrode 105 connected to a measuring instrument 340. The diameter of the mercury drop 105 is typically about 150 μm.

For the electrical measurements, the measuring instrument 340 is configured as a source measure unit, i.e. the measuring instrument 340 provides an output voltage via a voltage source 380 and simultaneously measures the resultant electric current via a current measuring unit 360. For the measurements, an electrical voltage is applied between the copper plate 330 and the mercury drop 105 and varied, at the same time the electric current through the sample is measured. The voltage varies cyclically between a pre-specified maximum value +V and a prespecified minimum value −V having a triangular wave form. The experiments were carried out using a source measure unit of the Keithley 2635 type.

Figure 4:
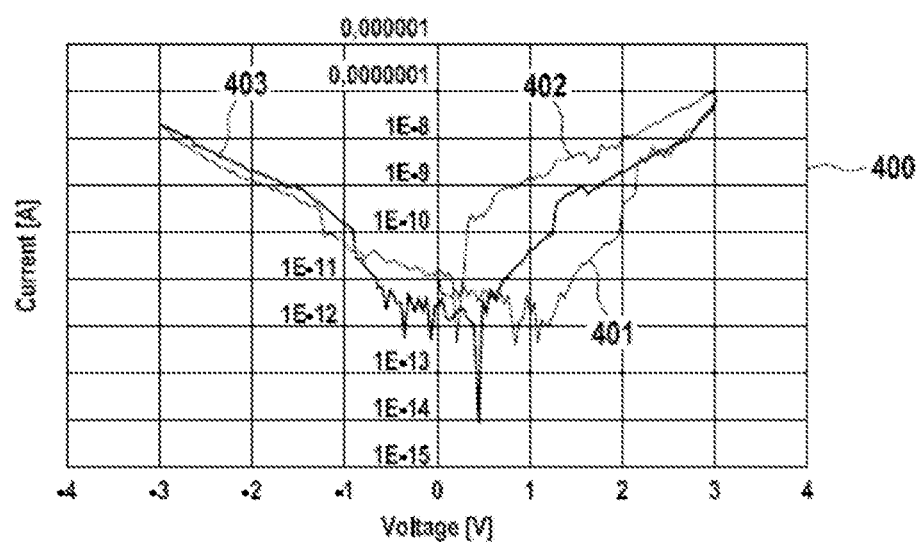
FIG. 4 shows a current-voltage curve of an electronic switching device fabricated by the process according to the invention.

The result of the characterisation of the device of Example 1 is shown in current voltage plot 400 in FIG. 4. In the first sweep 401 the voltage is increased from 0 V to +3 V, then in sweep 402 from +3 V to −3V and in a third sweep from −3 V back to +3V. The device shows hysteretic switching due to the presence of a resistive switching layer.

The water contact angle of the substrate comprising the molecular layer is 99°, ellipsometry shows a 1 nm thicker layer compared to a reference sample fabricated by ALD under the same conditions without the last step of molecular layer deposition. The presence of the fluorine-containing molecular layer can be detected by elemental analysis using XPS. Only negligible amounts of fluorine can be detected on the reference sample.

Example 2

The compound 2

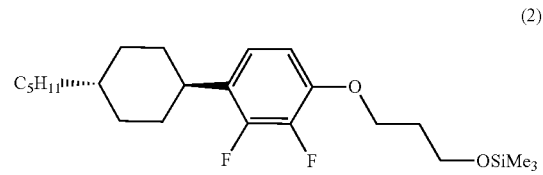

(2)

is deposited onto a tungsten anchoring layer on a substrate as follows:

A coupon as described in Example 1 is placed inside the processing chamber and 70 cycles of tungsten hexafluoride and disilane, respectively (pulse length 0.015 s each; substrate temperature 150° C., nitrogen carrier gas), to create an activated W-F-decorated surface. Then, compound (1) is evaporated (source temperature=170° C., vacuum approx 0.1 torr) onto the activated surface (substrate temperature=160° C., constant vapor stream at approx 0.1 Torr), forming a molecular layer.

Using similar processes, activated surfaces for the subsequent reaction with compounds of the formulae IA, IB or IC are prepared as follows. If not stated otherwise, the base pressure is set to 0.1-1 torr and the flow rates for carrier- and purging gas are adjusted to 50 sccm and 150 sccm, respectively.

$ZrO_2$— SAM: Substrate temperature 250° C.; 1. Zr($NEt_2$)$_4$; 2. $H_2O$; n cycles of 1. and 2.; followed by one pulse of Zr($NEt_2$)$_4$;

$HfO_2$— SAM: Substrate temperature 250° C.; 1. Hf($NEt_2$)$_4$; 2. $H_2O$; n cycles of 1. and 2.; followed by one pulse of Hf($NEt_2$)$_4$;

Cr-SAM: Substrate temperature 200° C.; 1. Cr((Me)(Bu)COCNtBu)$_2$; 2. $BH_3$($NHMe_2$); n cycles of 1. and 2.; followed by one pulse of Cr((Me)(tBu)COCNtBu)$_2$;

Co-SAM: Substrate temperature 200° C.; 1. Co((Me)(Bu)COCNtBu)$_2$; 2. $BH_3$($NHMe_2$); n cycles of 1. and 2.; followed by one pulse of Co((Me)(tBu)COCNtBu)$_2$;

TiN-SAM: Substrate temperature 350° C.; 1. Ti($NMe_2$); 2. $NH_3$ (300 W ICP-RF Plasma); n cycles of 1. and 2.; followed by one pulse of $TiCl_4$;

TaN-SAM: Substrate temperature 200° C.; 1. Ta(NtBu)($NEt_2$)$_3$; 2. $H_2$; n cycles of 1. and 2.; followed by one pulse of Ta(NtBu)($NEt_2$);

Si-SAM: Substrate temperature 350° C.; 1. SiCl$_4$; 2. Si$_2$H$_6$; SiCl$_4$; n cycles of 1. and 2.;

Ru-SAM: Substrate temperature 150° C.; 1. Ru(CpEt)(CO)$_2$Et; 2. O$_2$; n cycles of 1. and 2.; followed by one pulse of Ru(CpEt)$_2$;

RuO$_2$—SAM: Substrate temperature 150° C.; 1. Ru(CpEt)$_2$; 2. O$_2$; n cycles of 1. and 2. pulse length ratio: 1:20; followed by one pulse of Ru(CpEt)$_2$;

where n depends on the desired thickness of the layer and is an integer from 1 to 100.

The invention claimed is:

1. A process for production of an electronic component (100), the process comprising:
   (i) providing a substrate operable as a first electrode (102) having a surface, disposed in a deposition chamber,
   (ii) forming an anchoring layer (103) on said surface by serially exposing the substrate to first and second reactants in an atomic layer deposition process, the atomic layer deposition process ending with exposing the substrate to said first reactant to form a reactive surface, and
   (iii) forming a molecular layer (104) atop of said reactive surface employing physical vapor deposition of one or more compounds, where the one or more compounds are of flexible conformation and have a conformation-flexible molecular dipole moment and a reactive anchoring group G configured to react with the reactive layer,
   wherein molecular layer (104) is formed from one or more compounds selected from formulae IA, IB and IC:

$R^{1A}-(A^1-Z^1)_r-B^1-(Z^2-A^2)_s-Sp^A-G$ (IA)

$D^1-Z^D-(A^1-Z^1)_r-B^1-(Z^2-A^2)_s-Sp-G$ (IB)

$R^{1C}-(A^1-Z^1)_r-B^1-Z^L-A^{2C}-(Z^3-A^3)_s-Sp^C-G$ (IC)

in which
   $R^{1A}$, $R^{1C}$ denote straight chain or branched alkyl or alkoxy each having 1 to 20 C atoms, where one or more CH$_2$ groups in these radicals may each be replaced, independently of one another, by —C≡C—, —CH=CH—,

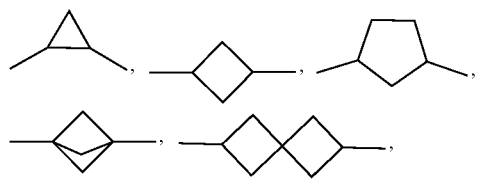

—O—, —S—, —CF$_2$O—, —OCF$_2$—, —CO—O—, —O—CO—, —SiR$^0$R$^{00}$—, —NH—, —NR$^0$— or —SO$_2$— in such a way that O atoms are not linked directly to one another, and in which one or more H atoms may each be replaced by halogen, CN, SCN or SF$_5$, where $R^{1C}$ alternatively denotes a group $D^1-Z^D$, $Z^D$ has one of the meanings of $Z^1$, $Z^2$ and $Z^3$ or denotes a spacer group, $Z^1$, $Z^2$, $Z^3$ on each occurrence, identically or differently, denote a single bond, —CF$_2$O—, —OCF$_2$—, —CF$_2$S—, —SCF$_2$—, —CH$_2$O—, —OCH$_2$—, —C(O)O—, —OC(O)—, —C(O)S—, —SC(O)—, —(CH$_2$)$_{n1}$—, —(CF$_2$)$_{n2}$—, —CF$_2$—CH$_2$—, —CH$_2$—CF$_2$—, —CH=CH—, —CF=CF—, —CF=CH—, —CH=CF—, —(CH$_2$)$_{n3}$O—, —O(CH$_2$)$_{n4}$—, —C≡C—, —O—, —S—, —CH=N—, —N=CH—, —N=N—, —N=N(O)—, —N(O)=N— or —N=C—C=N—, n1, n2, n3, n4 identically or differently, are 1, 2, 3, 4, 5, 6, 7, 8, 9 or 10, $Z^L$ denotes —O—, —S—, —CH$_2$—, —C(O)—, —CF$_2$—, —CHF—, —C(R$^x$)$_2$—, —S(O)— or —SO$_2$—, G denotes optionally silylated OH, or straight chain or branched alkyl having up to 12 C atoms in which one, two or three H atoms of the alkyl that are not geminal H atoms are substituted by optionally silylated OH; or an alkyl carbonate group in which alkyl is straight chain or branched alkyl having up to 12 C atoms; or trialkylsilylcarbonate, in which alkyl denotes alkyl having 1 to 6 C atoms, $D^1$ denotes a diamondoid radical, $A^1$, $A^2$, $A^3$ on each occurrence, identically or differently, denote an aromatic, heteroaromatic, alicyclic or heteroaliphatic ring having 4 to 25 ring atoms, which may also contain condensed rings and which may be mono- or polysubstituted by Y, $A^{2C}$ denotes an aromatic or heteroaromatic ring having 5 to 25 ring atoms, which may also contain condensed rings and which may be mono- or polysubstituted by $Y^C$, Y on each occurrence, identically or differently, denotes F, Cl, CN, SCN, SF$_5$ or straight-chain or branched, in each case optionally fluorinated alkyl, alkoxy, alkylcarbonyl, alkoxycarbonyl, alkylcarbonyloxy or alkoxycarbonyloxy having up to 12 C atoms, $Y^C$ on each occurrence, identically or differently, denotes F, Cl, CN, SCN, SF$_5$ or straight-chain or branched, in each case optionally fluorinated, alkyl, alkoxy, alkylcarbonyl, alkoxycarbonyl, alkylcarbonyloxy or alkoxycarbonyloxy having up to 12 C atoms, or cycloalkyl or alkylcycloalkyl each having 3 to 12 C atoms, $B^1$ denotes

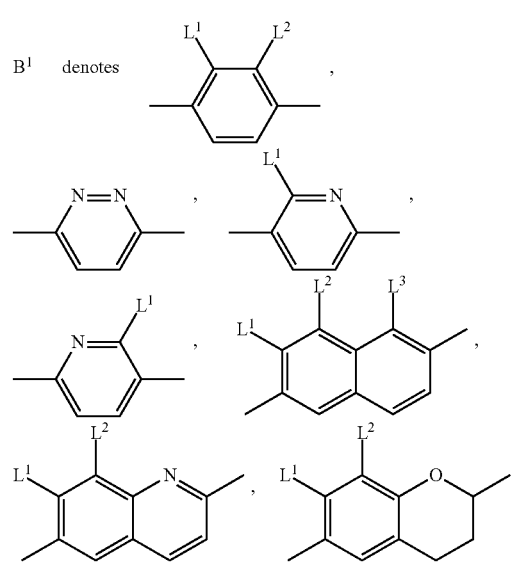

-continued

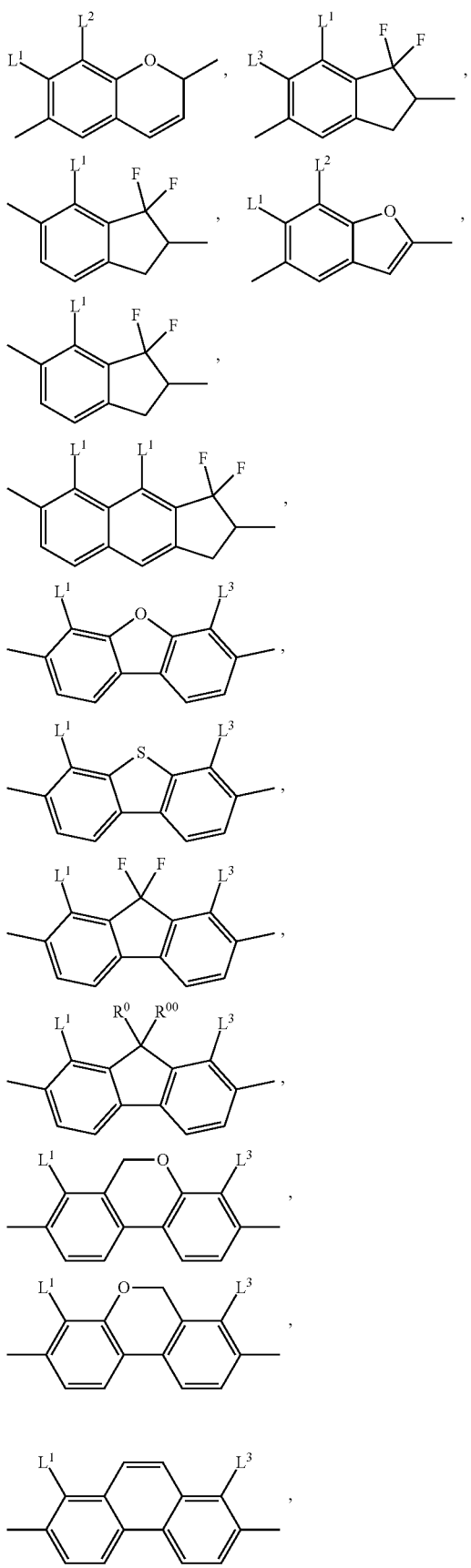

-continued

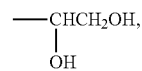

where the groups may be oriented in both directions,
$L^1$ to $L^5$, independently of one another, denote F, Cl, Br, I, CN, $SF_5$, $CF_3$ or $OCF_3$, where $L^3$ may alternatively also denote H,
$Sp^A$ denotes a spacer group or a single bond,
Sp denotes a spacer group or a single bond,
$Sp^C$ denotes a spacer group or a single bond,
$R^0$, $R^{00}$, identically or differently, denote an alkyl or alkoxy radical having 1 to 15 C atoms, in which, in addition, one or more H atoms may each be replaced by halogen,
$R^x$ denotes straight-chain or branched alkyl having up to 6 C atoms, and
r, s on each occurrence, identically or differently, are 0, 1 or 2.

2. The process according to claim 1, wherein before the steps (ii) and (iii) as set forth in claim 1, a first electrode (102) is formed by serially exposing a substrate (101) to first and second reactants in an atomic layer deposition process.

3. The process according to claim 2, wherein the first and second reactants forming the anchoring layer (103) and the first and second reactants forming the first electrode (102) are different from one another, respectively.

4. The process according to claim 2, wherein the first and second reactants forming the anchoring layer (103) and the first and second reactants forming the first electrode (102) are identical, respectively.

5. The process according to claim 2, wherein forming the first electrode (102), forming the anchoring layer (103), forming the reactive surface, and forming the molecular layer (104) occur in a common deposition chamber.

6. The process according to claim 2, wherein after the steps of forming the first electrode (102), forming the anchoring layer (103), forming the reactive surface, and forming the molecular layer (104), a second electrode (105) is formed.

7. The process according to claim 2, wherein the first electrode (102) comprises a material selected from the group consisting of Ag, Al, Au, Co, Cr, Cu, Mo, Nb, Ni, Pt, Ru, Si, W, CrN, HfN, MoN, NbN, TiN, TaN, WN, WCN, VN and ZrN.

8. The process according to claim 1, wherein forming the anchoring layer (103), forming the reactive surface, and forming the molecular layer (104) occur in a common deposition chamber.

9. The process according to claim 1, wherein the anchoring group G of the compounds forming the molecular layer (104) is selected from OH,

—CHCH$_2$OH,
|
OH

—CH(CH$_2$OH)$_2$, —COOH, and —O—C(O)—OR$^2$, in which $R^2$ denotes primary or secondary or tertiary alkyl having 1 to 6 C atoms.

10. The process according to claim 1, wherein a first reactant has fluorine atoms associated therewith and wherein the anchoring group G of the compounds forming the molecular layer (104) is selected from —OSiR$_3$, —COO-SiR$_3$, —CH(CH$_2$OSiR$_3$)$_2$,

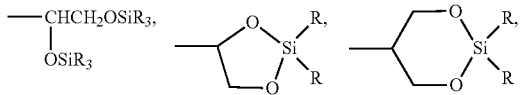

and —O—C(O)—OSiR$_3$
in which R, on each occurrence, identically or differently, denotes alkyl having 1 to 6 C atoms.

11. The process according to claim 1, wherein the substrate (101) comprises a material selected from the group consisting of Si, Ge, diamond, graphite, graphene, fullerene, α-Sn, B, Se, Te; GaAs, GaP, InP, InSb, InAs, GaSb, CrN, HfN, GaN, TaN, TiN, MON, NbN, WCN, WN, AlN, InN, VN, ZrN, Al$_x$Ga1−xAs and In$_x$Ga1−xNi, ZnO, ZnS, ZnSe, ZnTe, CdS, CdSe, CdTe, Hg(1−$_x$)Cd($_x$)Te, BeSe, BeTe$_x$ and HgS; GaS, GaSe, GaTe, InS, InSe$_x$ and InTe, CuInSe$_2$, CuInGaSe$_2$, CuInS$_2$ and CuInGaS$_2$, SiC and SiGe, SeTe; polythiophene, tetracene, pentacene, phthalocyanines, PTCDA, MePTCDI, quinacridone, acridone, indanthrone, flavanthrone, perinone, AlQ$_3$, PEDOT:PSS and polyvinylcarbazole/TLNQ complexes; Ta, Ti, Co, Cr, Mo, Nb, Ni, Pt, Ru, Au, Ag, Cu, Al, W and Mg; indium tin oxide, indium gallium oxide, InGa-α-ZnO, aluminium-doped zinc oxide, tin-doped zinc oxide, fluorine-doped tin oxide and antimony tin oxide.

12. The process according to claim 1, wherein the anchoring layer (103) comprises a material selected from the group consisting of Ag, Al, Au, Co, Cr, Cu, Mo, Nb, Ni, Pt, Ru, Si, W, CrN, HfN, MoN, NbN, TiN, TaN, WN, WCN, VN and ZrN, Al$_2$O$_3$, HfO$_2$, RuO$_2$, SiO$_2$, TiO$_2$, and ZrO$_2$.

13. The process according to claim 1, wherein D$^1$ is selected from adamantyl, diamantyl, and triamantyl, in which one or more H atoms can each be replaced by F.

* * * * *